(12) United States Patent
Gruber et al.

(10) Patent No.: US 9,236,884 B2
(45) Date of Patent: Jan. 12, 2016

(54) INTERPROCESSOR COMMUNICATIONS SYSTEMS AND METHODS

(71) Applicant: QUALCOMM Incorporated, San Diego, CA (US)

(72) Inventors: Hans Georg Gruber, San Diego, CA (US); Subra Dravida, Boxborough, MA (US); Parvathanathan Subrahmanya, Sunnyvale, CA (US); Vidyut Mukund Naware, Sunnyvale, CA (US); Helena Deirdre O'Shea, San Diego, CA (US); Garret Webster Shih, Brookline, MA (US); Jason Thurston, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 190 days.

(21) Appl. No.: 13/929,728

(22) Filed: Jun. 27, 2013

(65) Prior Publication Data

US 2014/0006908 A1 Jan. 2, 2014

Related U.S. Application Data

(60) Provisional application No. 61/666,702, filed on Jun. 29, 2012.

(51) Int. Cl.
  *H03M 13/09* (2006.01)
  *H03M 13/00* (2006.01)
  *H04L 1/00* (2006.01)

(52) U.S. Cl.
  CPC .............. *H03M 13/09* (2013.01); *H04L 1/004* (2013.01); *H04L 1/0061* (2013.01); *H04L 1/0072* (2013.01)

(58) Field of Classification Search
  None
  See application file for complete search history.

(56) References Cited

U.S. PATENT DOCUMENTS

| 5,072,449 | A | 12/1991 | Enns et al. |
| 6,463,059 | B1 | 10/2002 | Movshovich et al. |
| 8,244,933 | B1 | 8/2012 | New |
| 8,817,780 | B2 * | 8/2014 | Ramesh ............... H04N 21/235 370/252 |

(Continued)

FOREIGN PATENT DOCUMENTS

EP   942569 A2 *  9/1999   ............. H04L 29/06

OTHER PUBLICATIONS

International Search Report and Written Opinion—PCT/US2013/048764—ISA/EPO—Sep. 18, 2013.

(Continued)

*Primary Examiner* — Justin R Knapp
(74) *Attorney, Agent, or Firm* — Arent Fox LLP

(57) ABSTRACT

A method, an apparatus, and a computer program product for communication within a wireless terminal. The method can be implemented using dedicated logic and managed and controlled by state machines and/or sequencers. Data received or provided in a memory of a first integrated circuit of a terminal is encoded and transmitted in a data packet to a second integrated circuit. A header identifying the data type and providing a destination is included in the data packet. The destination may be identified as a memory address memory of the second integrated circuit that is mapped to a corresponding memory address of the first integrated circuit at which the data is received. In an aspect, the apparatus receives a header, detects an error in the received header, determines a failure to identify a packet boundary when the error is detected, and performs a search operation to identify the packet boundary.

36 Claims, 15 Drawing Sheets

(56) References Cited

U.S. PATENT DOCUMENTS

| | | | |
|---|---|---|---|
| 8,970,750 B2* | 3/2015 | Sugioka | G06T 1/0007 348/294 |
| 2007/0195822 A1* | 8/2007 | Chen et al. | 370/476 |
| 2008/0002567 A1 | 1/2008 | Bourlas et al. | |
| 2012/0203943 A1 | 8/2012 | Mutou | |
| 2012/0331365 A1 | 12/2012 | Nibe | |
| 2013/0044794 A1 | 2/2013 | Wenzel et al. | |

OTHER PUBLICATIONS

Shukla S., et al., "Single bit error correction implementation in CRC-16 on FPGA", Field-Programmable Technology, 2004. Proceedings. 2004 IEEE Internatio nal Conference on Bristane, Australia Dec. 6-8, 2004, Piscataway, NJ, USA,IEEE, Dec. 6, 2004, pp. 319-322, XP010767569, DOI: 10.1109/FPT.2004.1393289 ISBN: 978-0-7803-8651-8.

Tan M, et al., "The Implementation of Error Correction in ATM System", Wireless Communications Networking and Mobile Computing (WICOM), 2010 6th International Conference on, IEEE, Piscataway, NJ, USA, Sep. 23, 2010, pp. 1-3, XP031827606, ISBN: 978-1-4244-3708-5.

* cited by examiner

INTERPROCESSOR COMMUNICATIONS SYSTEMS AND METHODS

CROSS-REFERENCE TO RELATED APPLICATION(S)

This application claims the benefit of U.S. Provisional Application Ser. No. 61/666,702, entitled "INTERPROCESSOR COMMUNICATIONS SYSTEMS AND METHODS" and filed on Jun. 29, 2012, which is expressly incorporated by reference herein in its entirety.

BACKGROUND

1. Field

The present disclosure relates generally to wireless communications systems, and more particularly, to communications between baseband and radio frequency devices in wireless communication devices.

2. Background

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example of an emerging telecommunication standard is Long Term Evolution (LTE). LTE is a set of enhancements to the Universal Mobile Telecommunications System (UMTS) mobile standard promulgated by Third Generation Partnership Project (3GPP). It is designed to better support mobile broadband Internet access by improving spectral efficiency, lower costs, improve services, make use of new spectrum, and better integrate with other open standards using OFDMA on the downlink (DL), SC-FDMA on the uplink (UL), and multiple-input multiple-output (MIMO) antenna technology. However, as the demand for mobile broadband access continues to increase, there exists a need for further improvements in LTE technology. Preferably, these improvements should be applicable to other multi-access technologies and the telecommunication standards that employ these technologies.

SUMMARY

In an aspect of the disclosure, a lightweight protocol is defined that enables fast reliable inter-processor and inter-device communication within a wireless terminal. The lightweight protocol can be implemented using dedicated logic and managed and controlled by state machines and/or sequencers.

In an aspect of the disclosure, data is received or provided in a memory of a first integrated circuit (IC) of a wireless device and a data packet is generated to carry the data. The data packet may have a header identifying the data type and providing a destination of the data. The data packet may be encoded and transmitted to a second IC in the wireless device. The destination of the data may identify an address in memory of the second IC that is mapped to a corresponding address in the memory of the first IC at which the data is received.

In an aspect of the disclosure, the first IC comprises a baseband modem and the second IC comprises a radio frequency front end.

In an aspect of the disclosure, the first IC comprises a radio frequency front end and the second IC comprises a baseband modem.

In an aspect of the disclosure, the destination of the data comprises a destination field of the header, the destination field identifying a functional element of the second IC. The destination of the data may comprise a type field of the header that identifies the address in memory of the second IC that is mapped to the corresponding address in the memory of the first IC.

In an aspect of the disclosure, control information is communicated between the first and second ICs in one or more packets. The control information may comprise messages related to an automatic repeat request protocol. The first IC may comprise logic controlled by one or more state machines. Communicating control information between the first and second ICs in one or more packets may include receiving a packet at the first IC from the second IC. The packet received at the first IC may comprise a header having a cyclic redundancy check (CRC) field for the header of the packet received at the first IC, and wherein the logic in the first IC includes a CRC checker that determines whether the header of the packet received at the first IC is transmitted without error.

In an aspect of the disclosure, the data packet is retransmitted when the CRC checker determines that the header of the packet received at the first IC includes an error. A plurality of the one or more state machines may operate independently of one another. A plurality of the one or more state machines may operate without supervision of a processor. A plurality of the one or more state machines may operate without control of a processor.

In an aspect of the disclosure, the data packet comprises a payload. The beginning and end of the payload may be explicitly defined by the header. The header may comprise a CRC field that carries a header CRC that is calculated independently of a payload CRC carried by a field of the payload.

In an aspect of the disclosure, a plurality of addresses in the memory of the second IC are mapped to corresponding addresses in the memory of the first IC, and wherein the header is configured based on the mapping of the plurality of address.

In another aspect of the disclosure, a method, an apparatus, and a computer program product for communication are provided. The apparatus receives a packet header comprising a number of bytes, detects at least one error in the received packet header, determines a failure to identify a packet boundary when the at least one error is detected, and performs a search operation to identify the packet boundary.

DETAILED DESCRIPTION

Figure 1:
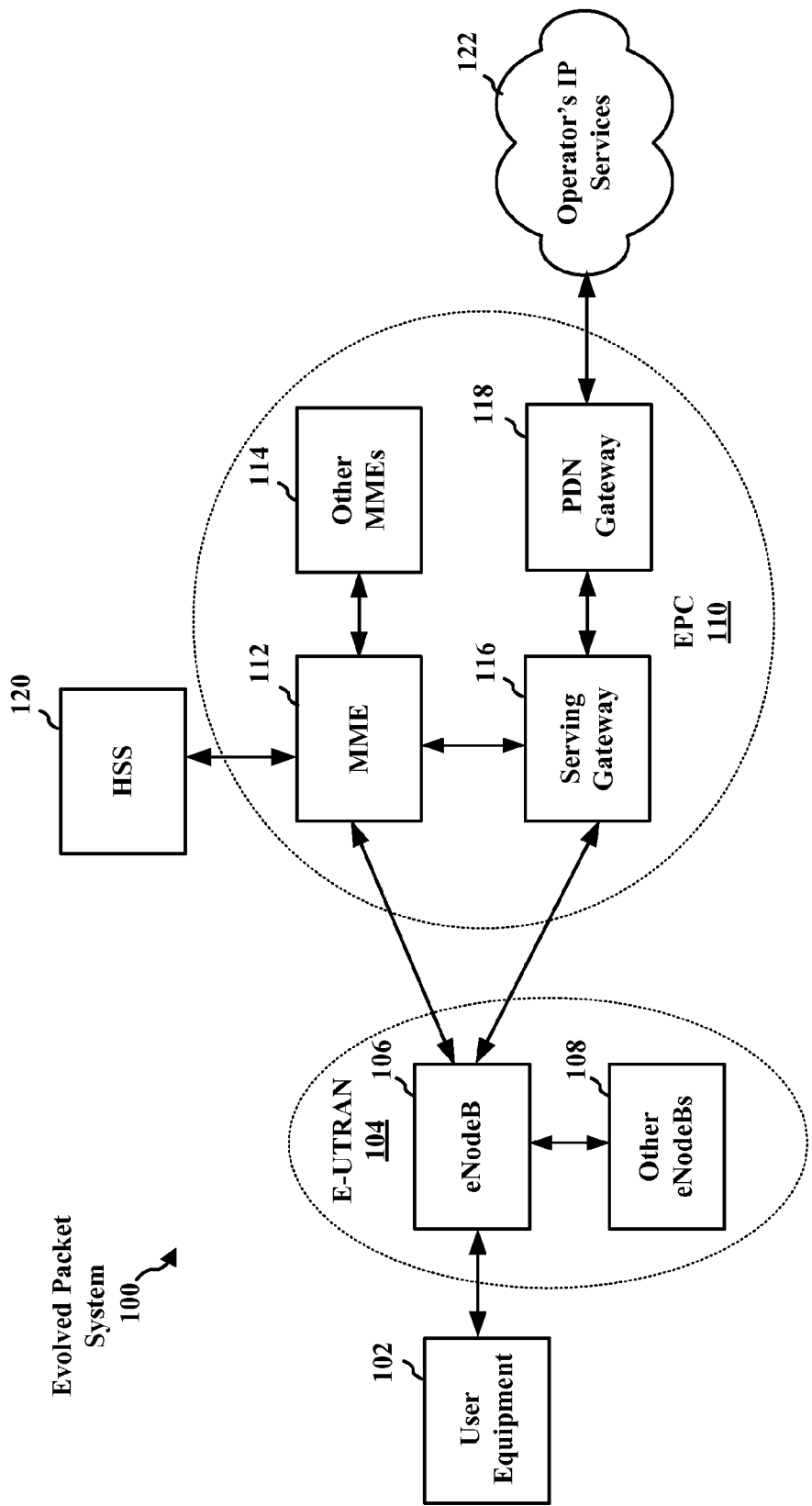
FIG. 1 is a diagram illustrating an example of a network architecture.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

FIG. 1 is a diagram illustrating an LTE network architecture 100. The LTE network architecture 100 may be referred to as an Evolved Packet System (EPS) 100. The EPS 100 may include one or more user equipment (UE) 102, an Evolved UMTS Terrestrial Radio Access Network (E-UTRAN) 104, an Evolved Packet Core (EPC) 110, a Home Subscriber Server (HSS) 120, and an Operator's IP Services 122. The EPS can interconnect with other access networks, but for simplicity those entities/interfaces are not shown. As shown, the EPS provides packet-switched services, however, as those skilled in the art will readily appreciate, the various concepts presented throughout this disclosure may be extended to networks providing circuit-switched services.

The E-UTRAN includes the evolved Node B (eNB) 106 and other eNBs 108. The eNB 106 provides user and control planes protocol terminations toward the UE 102. The eNB 106 may be connected to the other eNBs 108 via a backhaul (e.g., an X2 interface). The eNB 106 may also be referred to as a base station, a base transceiver station, a radio base station, a radio transceiver, a transceiver function, a basic service set (BSS), an extended service set (ESS), or some other suitable terminology. The eNB 106 provides an access point to the EPC 110 for a UE 102. Examples of UEs 102 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, or any other similar functioning device. The UE 102 may also be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

The eNB 106 is connected by an S1 interface to the EPC 110. The EPC 110 includes a Mobility Management Entity (MME) 112, other MMEs 114, a Serving Gateway 116, and a Packet Data Network (PDN) Gateway 118. The MME 112 is the control node that processes the signaling between the UE 102 and the EPC 110. Generally, the MME 112 provides bearer and connection management. All user IP packets are transferred through the Serving Gateway 116, which itself is connected to the PDN Gateway 118. The PDN Gateway 118 provides UE IP address allocation as well as other functions. The PDN Gateway 118 is connected to the Operator's IP Services 122. The Operator's IP Services 122 may include the Internet, the Intranet, an IP Multimedia Subsystem (IMS), and a PS Streaming Service (PSS).

Figure 2:
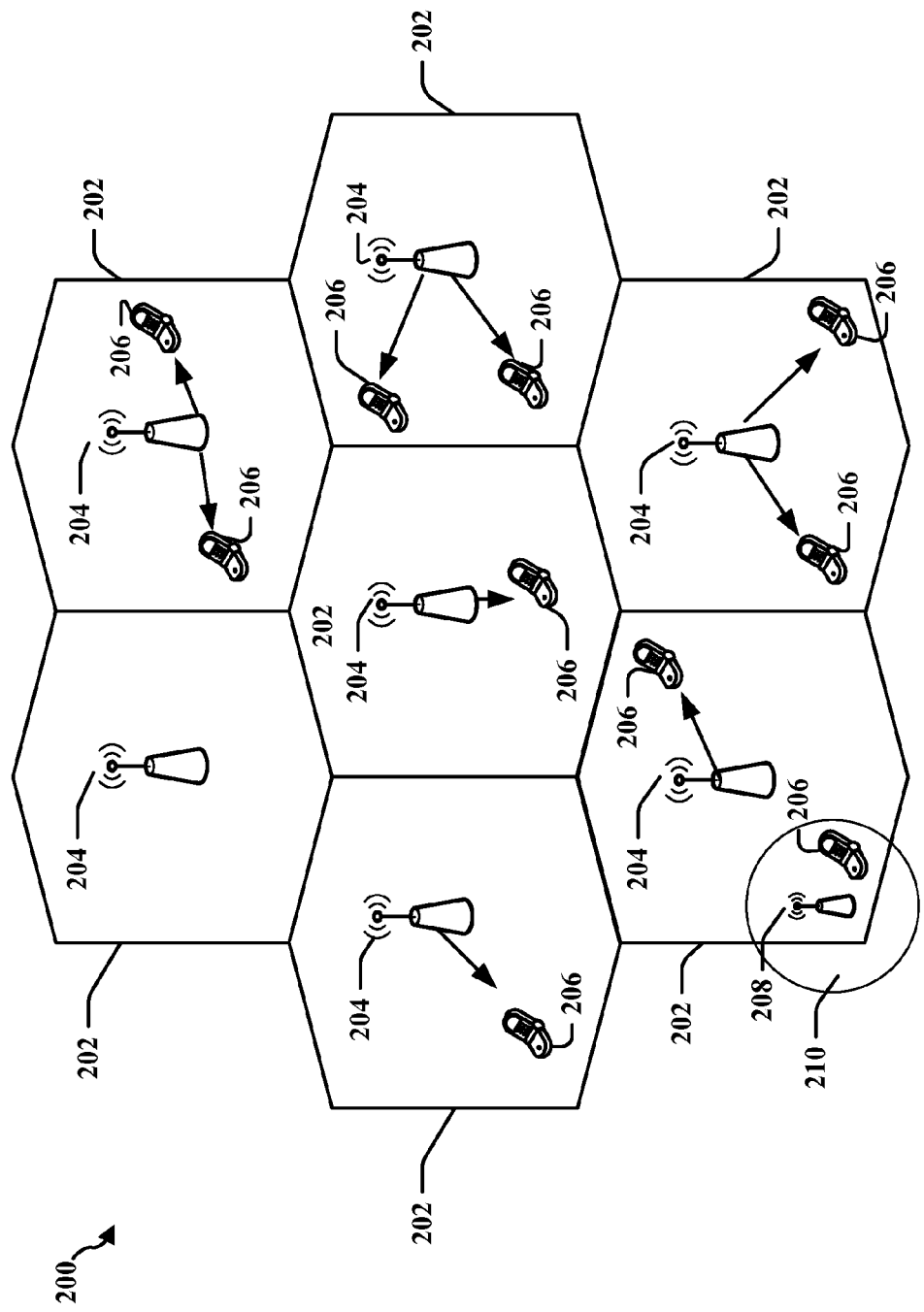
FIG. 2 is a diagram illustrating an example of an access network.

FIG. 2 is a diagram illustrating an example of an access network 200 in an LTE network architecture. In this example, the access network 200 is divided into a number of cellular regions (cells) 202. One or more lower power class eNBs 208 may have cellular regions 210 that overlap with one or more of the cells 202. The lower power class eNB 208 may be a femto cell (e.g., home eNB (HeNB)), pico cell, micro cell, or remote radio head (RRH). The macro eNBs 204 are each assigned to a respective cell 202 and are configured to provide an access point to the EPC 110 for all the UEs 206 in the cells 202. There is no centralized controller in this example of an access network 200, but a centralized controller may be used in alternative configurations. The eNBs 204 are responsible for all radio related functions including radio bearer control, admission control, mobility control, scheduling, security, and connectivity to the serving gateway 116.

The modulation and multiple access scheme employed by the access network 200 may vary depending on the particular telecommunications standard being deployed. In LTE applications, OFDM is used on the DL and SC-FDMA is used on the UL to support both frequency division duplexing (FDD) and time division duplexing (TDD). As those skilled in the art will readily appreciate from the detailed description to follow, the various concepts presented herein are well suited for LTE applications. However, these concepts may be readily extended to other telecommunication standards employing other modulation and multiple access techniques. By way of example, these concepts may be extended to Evolution-Data Optimized (EV-DO) or Ultra Mobile Broadband (UMB). EV-DO and UMB are air interface standards promulgated by the 3rd Generation Partnership Project 2 (3GPP2) as part of the CDMA2000 family of standards and employs CDMA to provide broadband Internet access to mobile stations. These concepts may also be extended to Universal Terrestrial Radio Access (UTRA) employing Wideband-CDMA (W-CDMA) and other variants of CDMA, such as TD-SCDMA; Global System for Mobile Communications (GSM) employing TDMA; and Evolved UTRA (E-UTRA), IEEE 802.11 (Wi-Fi), IEEE 802.16 (WiMAX), IEEE 802.20, and Flash-OFDM employing OFDMA. UTRA, E-UTRA, UMTS, LTE and GSM are described in documents from the 3GPP organization. CDMA2000 and UMB are described in documents from the 3GPP2 organization. The actual wireless communication standard and the multiple access technology employed will depend on the specific application and the overall design constraints imposed on the system.

The eNBs 204 may have multiple antennas supporting MIMO technology. The use of MIMO technology enables the eNBs 204 to exploit the spatial domain to support spatial multiplexing, beamforming, and transmit diversity. Spatial multiplexing may be used to transmit different streams of data simultaneously on the same frequency. The data steams may be transmitted to a single UE 206 to increase the data rate or to multiple UEs 206 to increase the overall system capacity. This is achieved by spatially precoding each data stream (i.e., applying a scaling of an amplitude and a phase) and then transmitting each spatially precoded stream through multiple transmit antennas on the DL. The spatially precoded data streams arrive at the UE(s) 206 with different spatial signatures, which enables each of the UE(s) 206 to recover the one or more data streams destined for that UE 206. On the UL, each UE 206 transmits a spatially precoded data stream, which enables the eNB 204 to identify the source of each spatially precoded data stream.

Spatial multiplexing is generally used when channel conditions are good. When channel conditions are less favorable, beamforming may be used to focus the transmission energy in one or more directions. This may be achieved by spatially precoding the data for transmission through multiple antennas. To achieve good coverage at the edges of the cell, a single stream beamforming transmission may be used in combination with transmit diversity.

In the detailed description that follows, various aspects of an access network will be described with reference to a MIMO system supporting OFDM on the DL. OFDM is a spread-spectrum technique that modulates data over a number of subcarriers within an OFDM symbol. The subcarriers are spaced apart at precise frequencies. The spacing provides "orthogonality" that enables a receiver to recover the data from the subcarriers. In the time domain, a guard interval (e.g., cyclic prefix) may be added to each OFDM symbol to combat inter-OFDM-symbol interference. The UL may use SC-FDMA in the form of a DFT-spread OFDM signal to compensate for high peak-to-average power ratio (PAPR).

Figure 3:
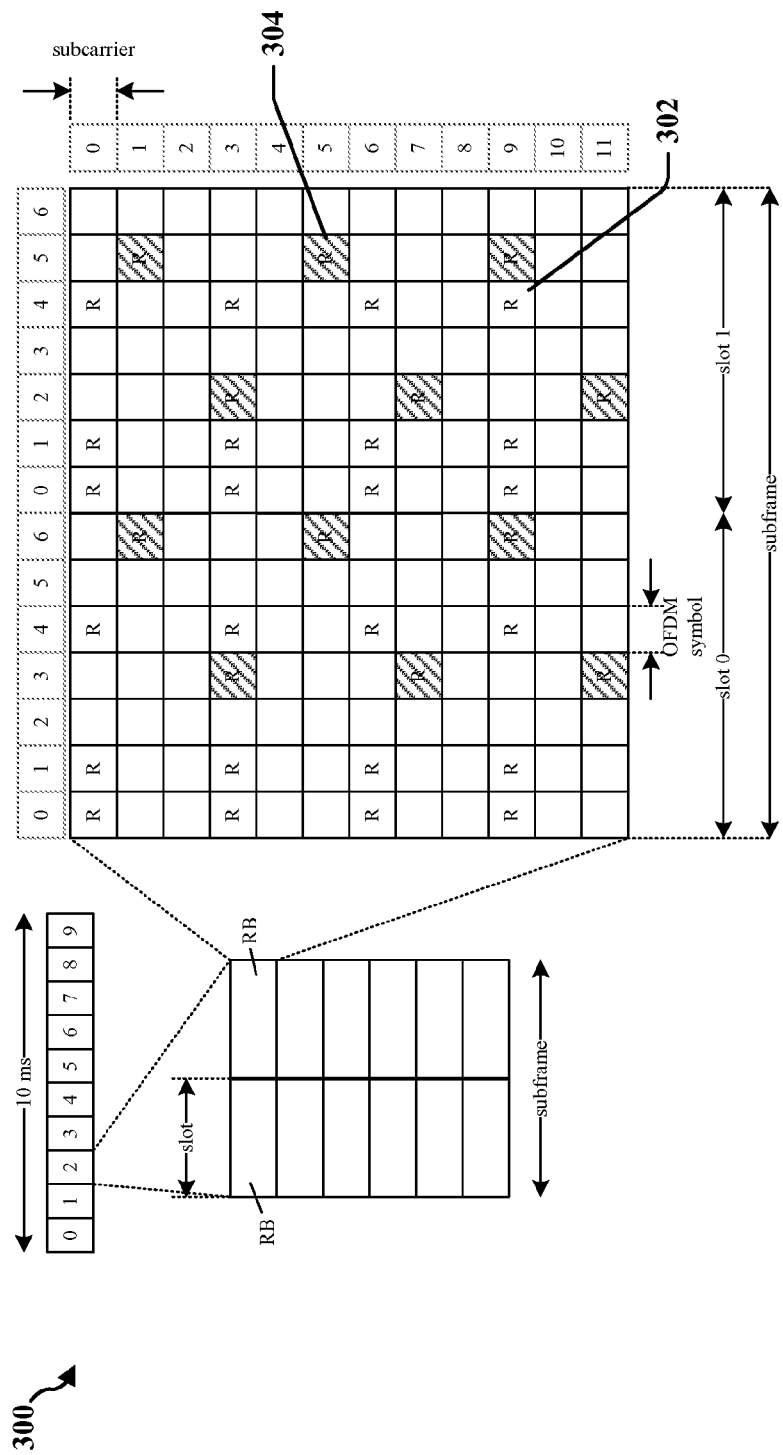
FIG. 3 is a diagram illustrating an example of a DL frame structure in LTE.

FIG. 3 is a diagram 300 illustrating an example of a DL frame structure in LTE. A frame (10 ms) may be divided into 10 equally sized sub-frames. Each sub-frame may include two consecutive time slots. A resource grid may be used to represent two time slots, each time slot including a resource block. The resource grid is divided into multiple resource elements. In LTE, a resource block contains 12 consecutive subcarriers in the frequency domain and, for a normal cyclic prefix in each OFDM symbol, 7 consecutive OFDM symbols in the time domain, or 84 resource elements. For an extended cyclic prefix, a resource block contains 6 consecutive OFDM symbols in the time domain and has 72 resource elements. Some of the resource elements, as indicated as R 302, 304, include DL reference signals (DL-RS). The DL-RS include Cell-specific RS (CRS) (also sometimes called common RS) 302 and UE-specific RS (UE-RS) 304. UE-RS 304 are transmitted only on the resource blocks upon which the corresponding physical DL shared channel (PDSCH) is mapped. The number of bits carried by each resource element depends on the modulation scheme. Thus, the more resource blocks that a UE receives and the higher the modulation scheme, the higher the data rate for the UE.

Figure 4:
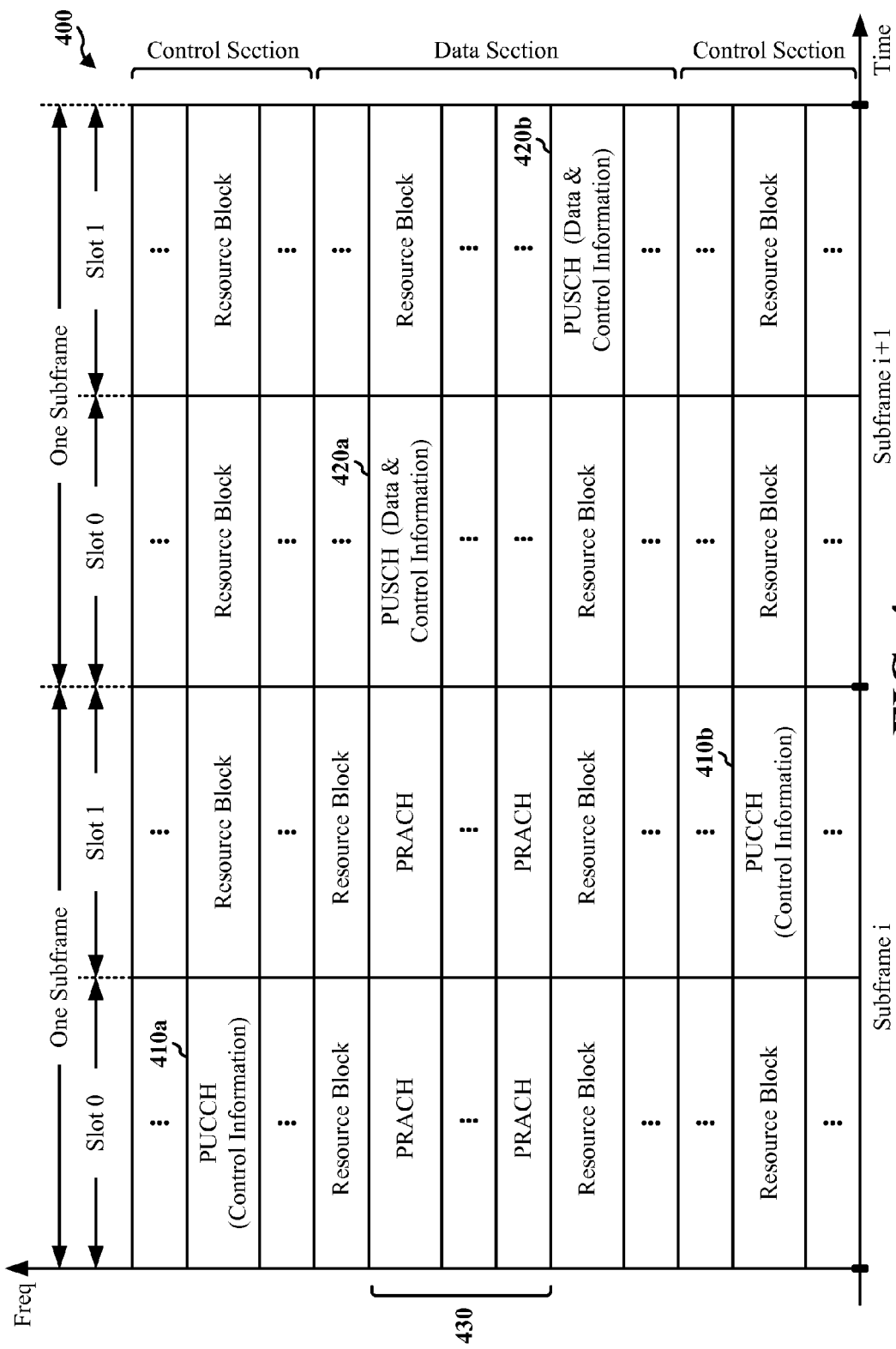
FIG. 4 is a diagram illustrating an example of an UL frame structure in LTE.

FIG. 4 is a diagram 400 illustrating an example of an UL frame structure in LTE. The available resource blocks for the UL may be partitioned into a data section and a control section. The control section may be formed at the two edges of the system bandwidth and may have a configurable size. The resource blocks in the control section may be assigned to UEs for transmission of control information. The data section may include all resource blocks not included in the control section. The UL frame structure results in the data section including contiguous subcarriers, which may allow a single UE to be assigned all of the contiguous subcarriers in the data section.

A UE may be assigned resource blocks 410a, 410b in the control section to transmit control information to an eNB. The UE may also be assigned resource blocks 420a, 420b in the data section to transmit data to the eNB. The UE may transmit control information in a physical UL control channel (PUCCH) on the assigned resource blocks in the control section. The UE may transmit only data or both data and control information in a physical UL shared channel (PUSCH) on the assigned resource blocks in the data section. A UL transmission may span both slots of a subframe and may hop across frequency.

A set of resource blocks may be used to perform initial system access and achieve UL synchronization in a physical random access channel (PRACH) 430. The PRACH 430 carries a random sequence and cannot carry any UL data/signaling. Each random access preamble occupies a bandwidth corresponding to six consecutive resource blocks. The starting frequency is specified by the network. That is, the transmission of the random access preamble is restricted to certain time and frequency resources. There is no frequency hopping for the PRACH. The PRACH attempt is carried in a single subframe (1 ms) or in a sequence of few contiguous subframes and a UE can make only a single PRACH attempt per frame (10 ms).

Figure 5:
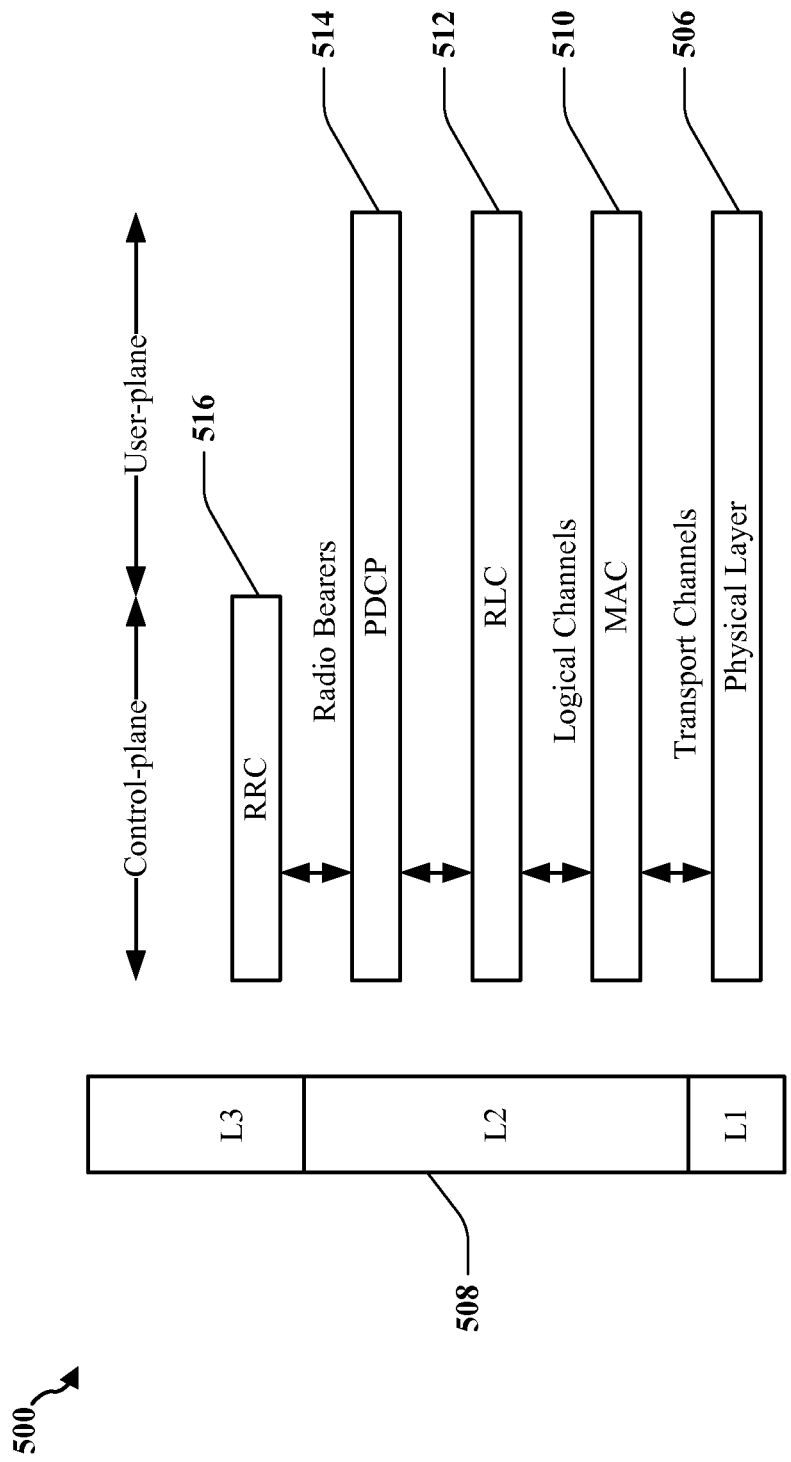
FIG. 5 is a diagram illustrating an example of a radio protocol architecture for the user and control planes.

FIG. 5 is a diagram 500 illustrating an example of a radio protocol architecture for the user and control planes in LTE. The radio protocol architecture for the UE and the eNB is shown with three layers: Layer 1, Layer 2, and Layer 3. Layer 1 (L1 layer) is the lowest layer and implements various physical layer signal processing functions. The L1 layer will be referred to herein as the physical layer 506. Layer 2 (L2 layer) 508 is above the physical layer 506 and is responsible for the link between the UE and eNB over the physical layer 506.

In the user plane, the L2 layer 508 includes a media access control (MAC) sublayer 510, a radio link control (RLC) sublayer 512, and a packet data convergence protocol (PDCP) 514 sublayer, which are terminated at the eNB on the network side. Although not shown, the UE may have several upper layers above the L2 layer 508 including a network layer (e.g., IP layer) that is terminated at the PDN gateway 118 on the network side, and an application layer that is terminated at the other end of the connection (e.g., far end UE, server, etc.).

The PDCP sublayer 514 provides multiplexing between different radio bearers and logical channels. The PDCP sublayer 514 also provides header compression for upper layer data packets to reduce radio transmission overhead, security by ciphering the data packets, and handover support for UEs between eNBs. The RLC sublayer 512 provides segmentation and reassembly of upper layer data packets, retransmission of lost data packets, and reordering of data packets to compensate for out-of-order reception due to hybrid automatic repeat request (HARQ). The MAC sublayer 510 provides multiplexing between logical and transport channels. The MAC sublayer 510 is also responsible for allocating the various radio resources (e.g., resource blocks) in one cell among the UEs. The MAC sublayer 510 is also responsible for HARQ operations.

In the control plane, the radio protocol architecture for the UE and eNB is substantially the same for the physical layer 506 and the L2 layer 508 with the exception that there is no header compression function for the control plane. The control plane also includes a radio resource control (RRC) sublayer 516 in Layer 3 (L3 layer). The RRC sublayer 516 is responsible for obtaining radio resources (i.e., radio bearers) and for configuring the lower layers using RRC signaling between the eNB and the UE.

Figure 6:
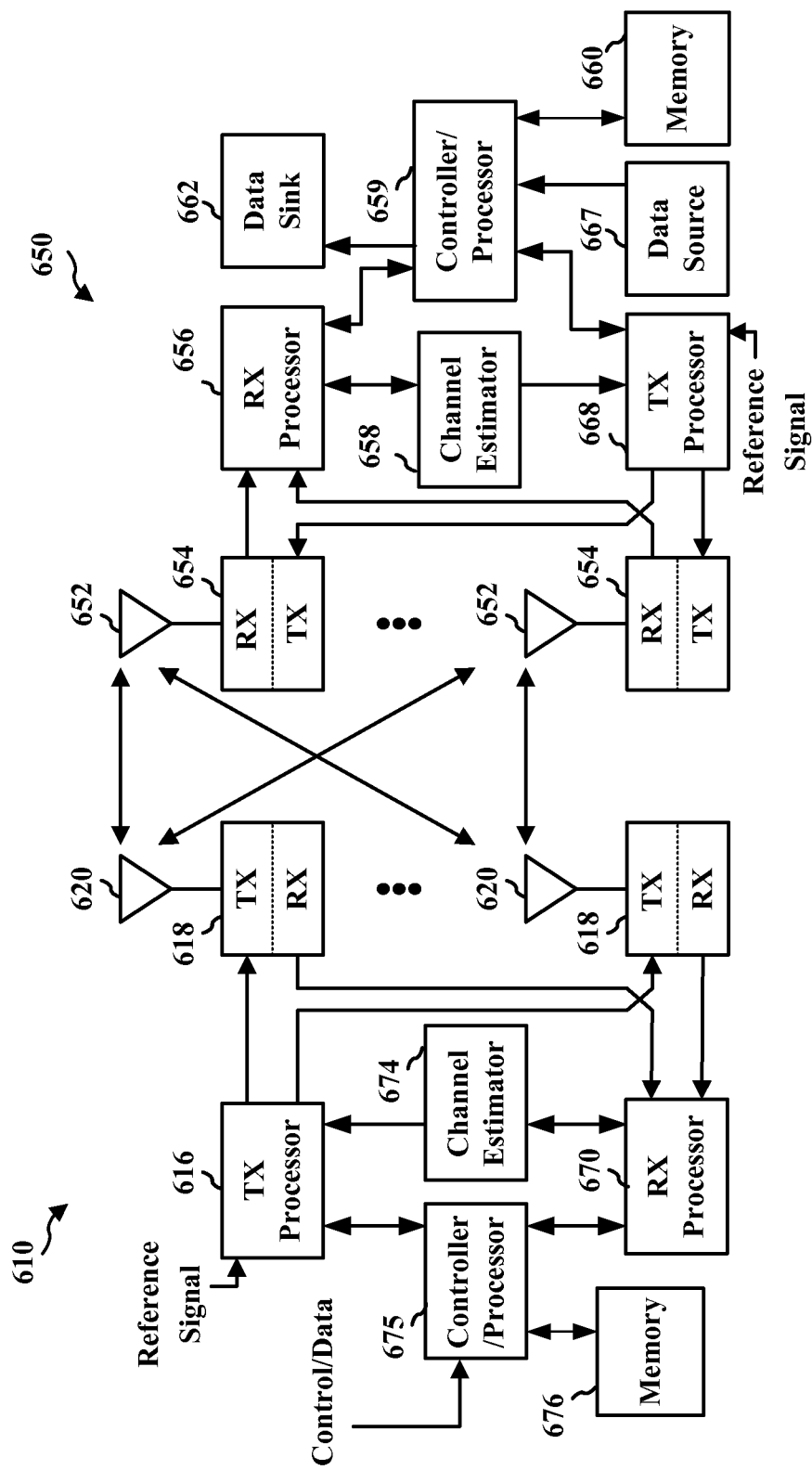
FIG. 6 is a diagram illustrating an example of an evolved Node B and user equipment in an access network.

FIG. 6 is a block diagram of an eNB 610 in communication with a UE 650 in an access network. In the DL, upper layer packets from the core network are provided to a controller/processor 675. The controller/processor 675 implements the functionality of the L2 layer. In the DL, the controller/processor 675 provides header compression, ciphering, packet segmentation and reordering, multiplexing between logical and transport channels, and radio resource allocations to the UE 650 based on various priority metrics. The controller/processor 675 is also responsible for HARQ operations, retransmission of lost packets, and signaling to the UE 650.

The transmit (TX) processor 616 implements various signal processing functions for the L1 layer (i.e., physical layer). The signal processing functions includes coding and interleaving to facilitate forward error correction (FEC) at the UE 650 and mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols are then split into parallel streams. Each stream is then mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 674 may be used to determine the coding and modulation scheme, as well as for spatial processing. The channel estimate may be derived from a reference signal and/or channel condition feedback transmitted by the UE 650. Each spatial stream is then provided to a different antenna 620 via a separate transmitter 618TX. Each transmitter 618TX modulates an RF carrier with a respective spatial stream for transmission.

At the UE 650, each receiver 654RX receives a signal through its respective antenna 652. Each receiver 654RX recovers information modulated onto an RF carrier and provides the information to the receive (RX) processor 656. The RX processor 656 implements various signal processing functions of the L1 layer. The RX processor 656 performs spatial processing on the information to recover any spatial streams destined for the UE 650. If multiple spatial streams are destined for the UE 650, they may be combined by the RX processor 656 into a single OFDM symbol stream. The RX processor 656 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, is recovered and demodulated by determining the most likely signal constellation points transmitted by the eNB 610. These soft decisions may be based on channel estimates computed by the channel estimator 658. The soft decisions are then decoded and deinterleaved to recover the data and control signals that were originally transmitted by the eNB 610 on the physical channel. The data and control signals are then provided to the controller/processor 659.

The controller/processor 659 implements the L2 layer. The controller/processor can be associated with a memory 660 that stores program codes and data. The memory 660 may be referred to as a computer-readable medium. In the UL, the controller/processor 659 provides demultiplexing between transport and logical channels, packet reassembly, deciphering, header decompression, control signal processing to recover upper layer packets from the core network. The upper layer packets are then provided to a data sink 662, which represents all the protocol layers above the L2 layer. Various control signals may also be provided to the data sink 662 for L3 processing. The controller/processor 659 is also responsible for error detection using an acknowledgement (ACK) and/or negative acknowledgement (NACK) protocol to support HARQ operations.

In the UL, a data source 667 is used to provide upper layer packets to the controller/processor 659. The data source 667 represents all protocol layers above the L2 layer. Similar to the functionality described in connection with the DL transmission by the eNB 610, the controller/processor 659 implements the L2 layer for the user plane and the control plane by providing header compression, ciphering, packet segmentation and reordering, and multiplexing between logical and transport channels based on radio resource allocations by the eNB 610. The controller/processor 659 is also responsible for HARQ operations, retransmission of lost packets, and signaling to the eNB 610.

Channel estimates derived by a channel estimator 658 from a reference signal or feedback transmitted by the eNB 610 may be used by the TX processor 668 to select the appropriate coding and modulation schemes, and to facilitate spatial processing. The spatial streams generated by the TX processor 668 are provided to different antenna 652 via separate transmitters 654TX. Each transmitter 654TX modulates an RF carrier with a respective spatial stream for transmission.

The UL transmission is processed at the eNB 610 in a manner similar to that described in connection with the receiver function at the UE 650. Each receiver 618RX receives a signal through its respective antenna 620. Each receiver 618RX recovers information modulated onto an RF carrier and provides the information to a RX processor 670. The RX processor 670 may implement the L1 layer.

The controller/processor 675 implements the L2 layer. The controller/processor 675 can be associated with a memory 676 that stores program codes and data. The memory 676 may be referred to as a computer-readable medium. In the UL, the control/processor 675 provides demultiplexing between transport and logical channels, packet reassembly, deciphering, header decompression, control signal processing to recover upper layer packets from the UE 650. Upper layer packets from the controller/processor 675 may be provided to the core network. The controller/processor 675 is also responsible for error detection using an ACK and/or NACK protocol to support HARQ operations.

Certain embodiments overcome deficiencies and inefficiencies associated with conventional inter-processor communication interfaces such as the standardized mobile industry processor interface (MIPI). In some embodiments, the high bandwidth overhead of conventional interfaces can be substantially reduced. In conventional systems the physical (PHY) layer can consume 20% or more of the bandwidth because of line encoding. Certain embodiments can suppress multi-layer error multiplication effects caused by random bit errors that can lead to loss of packet demarcation such that random errors in conventional PHY layers can cause a burst of errors at the application layer. Certain embodiments operate with a single clock source, which may be shared with other elements of a system. Conventional systems typically require two or more independent clock sources and incorporate additional control software in link protocols, thereby driving system complexity. System complexity may be further reduced in some embodiments through the use of sequencing logic, such as state machines, to handle the communications protocol between devices in a wireless device.

Certain embodiments provide advanced digital interfaces between baseband and radio frequency (RF) devices in wireless handsets. The advanced digital interface may optimize RF and baseband functions, including software and hardware functions. Device input/output pin count may be reduced, performance increased, and printed circuit board area usage minimized. The digital interface may be used to interconnect a baseband RF modem with a RF integrated circuit (RF-IC), providing reduced complexity of RF calibration when the baseband modem is mated with a suitable RF IC, providing an appropriate set of functions that optimizes cost for the chipset. In one example a single mode LTE baseband chip can be mated with an RF-IC having two RF receive paths suitable for a single carrier solution, or mated with an RF-IC having 4 RF receive paths/chains to provide carrier aggregation. In another example, a single mode LTE baseband chip can be mated with an inexpensive RF-IC that only covers high band and TDD signals.

Certain embodiments of the invention provide a digital interface between baseband modem and RF IC that minimizes traffic to the baseband modem using an RF front end (RFFE) control bus operating from the RF-IC using an interface with low bandwidth overhead, low latency, and that offers robust performance. In some embodiments, a protocol is used that allows for differentiated treatment of packets. For example, data and control packets may be distinguished and handled with different levels of error detection and correction. Moreover, multiple data rates may be supported and data reliably transported with low bandwidth overhead and low latency.

A light-weight protocol may be used that does not require or employ line encoding. A memory-mapped architecture automatically routes and stores packets in the correct memory locations at the destination. Protocols are used that take advantage of the memory mapped architecture, providing simple address encoding and decoding and eliminating memory fragmentation. The protocols typically employed do not exhibit the complexity associated with segmentation and reassembly associated with conventional protocols.

In some embodiments a 64 b/66 b encoding scheme is used to optimize communications efficiency and simplify link transfers. The 64 b/66 b encoding scheme transforms 64-bit data to 66-bit line code with sufficient state changes to ensure alignment of the data stream and clock recovery at the receiver. The overhead of the 64 b/66 b encoding scheme is 3.125% (2/64), which is considerably less than the overhead of encoding schemes such as the 8 b/10 b encoding scheme which has a 25% overhead. Synchronization and byte alignment may be achieved using configurable logic at the receiver, although byte alignment may not be required in some embodiments.

Figure 7:
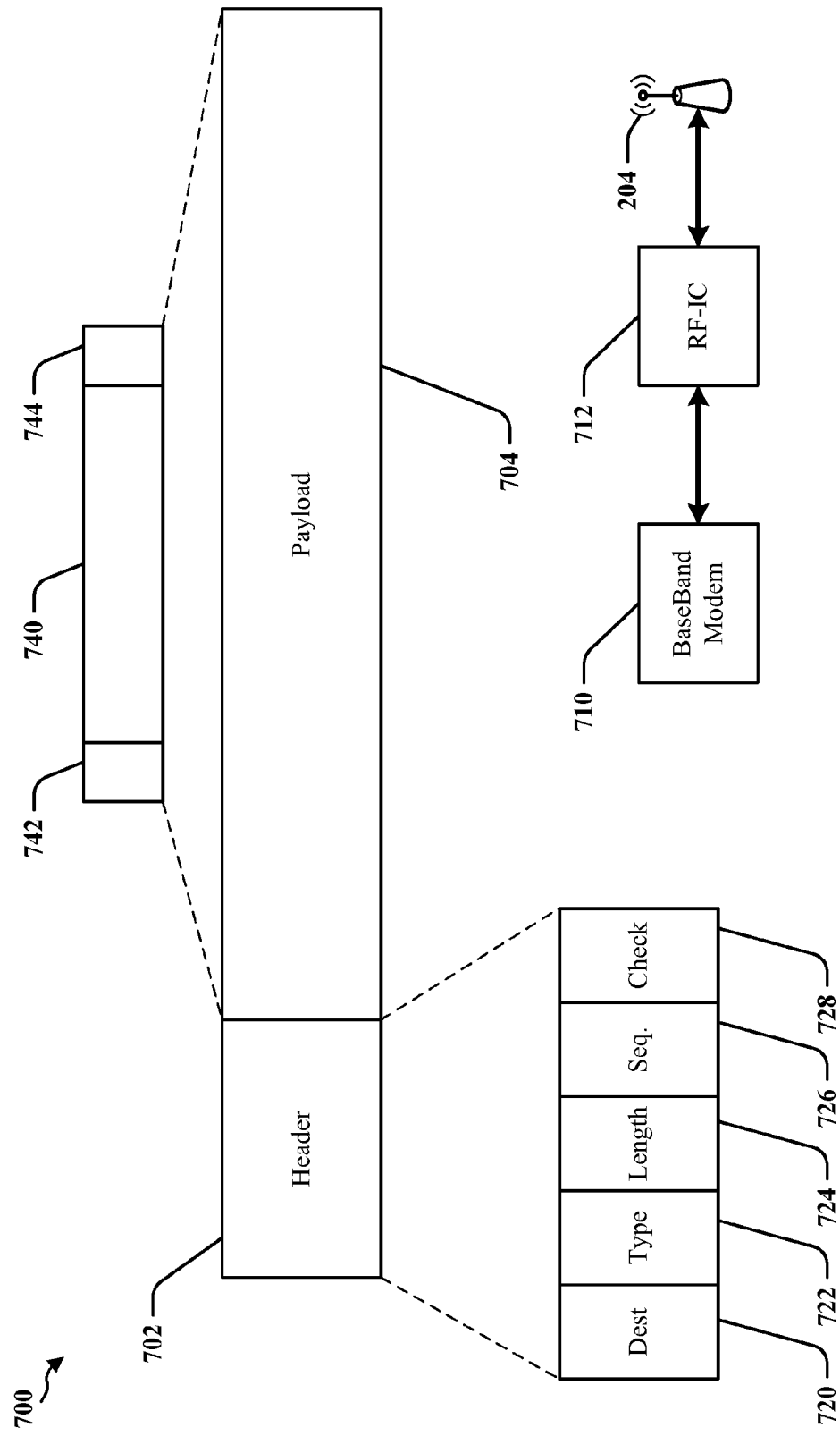
FIG. 7 is a diagram illustrating a packet used for communication between devices within a wireless terminal.

FIG. 7 is a diagram illustrating a format of a packet 700 used in some embodiments for communication between a baseband modem 710 and an RF-IC 712. RF-IC 712 may be adapted to control transmissions and signal reception through one or more antennas 204 provided in a wireless device. Packet 700 may comprise a packet header 702 and packet payload 704. Configurable fields of header 702 may define a plurality of functions, including control and error handling functions. For example, a destination field 720 may facilitate routing of the packet 700. Type field 722 may be used to indicate a specific use of the payload 704. A length field 724 may provide information related to demarcation while a sequence number field 726 can be used for loss detection and packet recovery. Header check code may 728 may be used to check received header integrity and to guard against random errors.

In some embodiments, the protocol leverages a dedicated header construct and configures a simplified payload structure. An improved bit error rate in the header 702 allows simplification of the protocol payload 704 by ensuring error-free demarcation of the packet 700 (and payload 704). Payload 704 may comprise a payload header 742, a payload trailer 744 and payload data 740. The payload header 742 and trailer 744 may provide a degree of error checking and the trailer may include a payload cyclic redundancy check 746.

Figure 8:
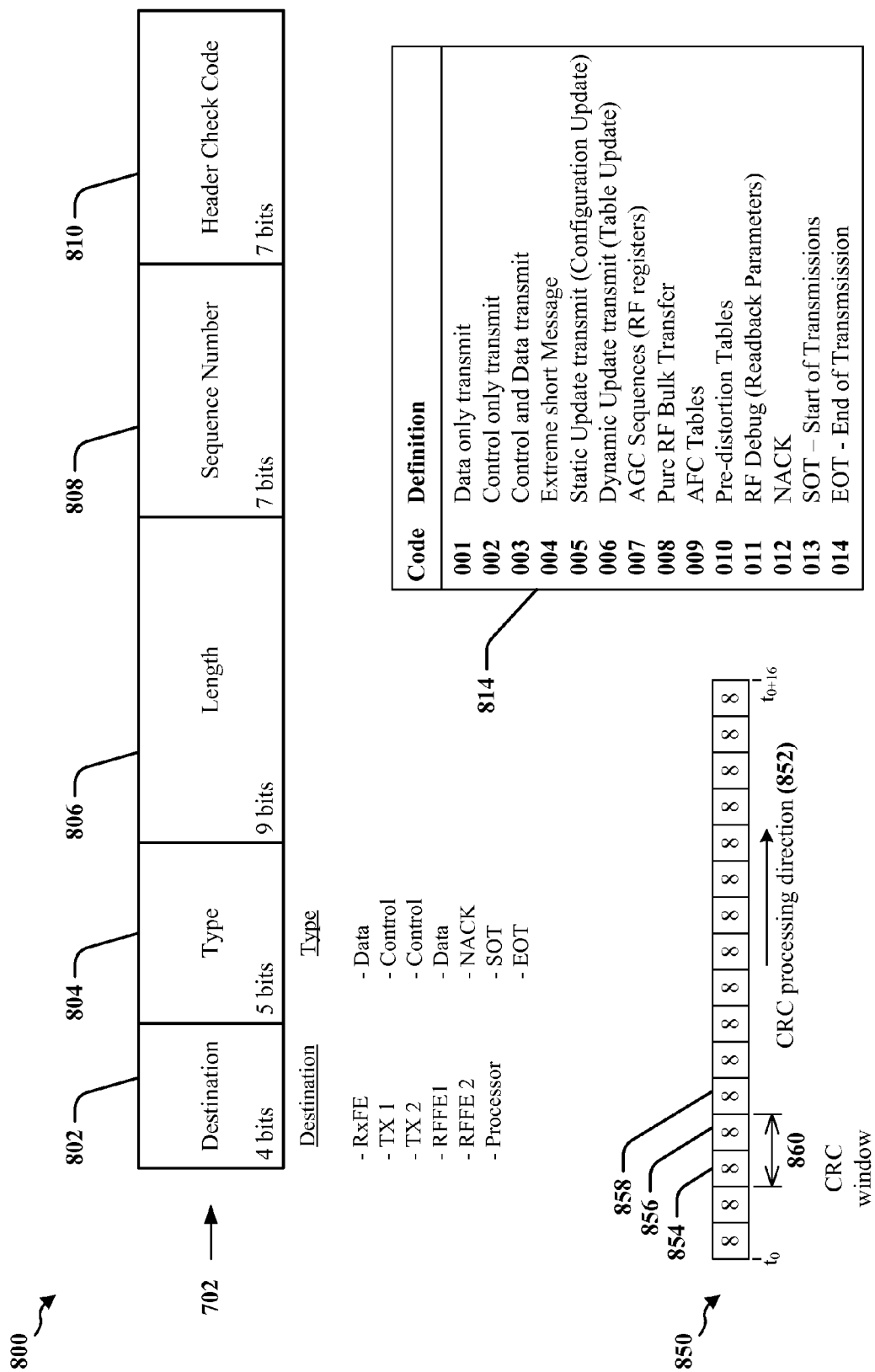
FIG. 8 is a diagram illustrating a packet header used for communication between devices within a wireless terminal.

FIG. 8 is a diagram 800 illustrating one example of packet header 702, shown in more detail. Header 702 may comprise a destination field 802 that identifies a destination for the payload 704. In one example, destination field 802 comprises a 4-bit code, enabling a total of 16 destination codes that may be assigned according to application. For example, a packet 700 transmitted from a baseband modem 710 to RF-IC 712 may identify, as a destination, a receiver front end, first transmitter, second transmitter, first radio-frequency front-end (RFFE), second RFFE, a microprocessor or processor used to perform measurements or other functions. In the direction of RF-IC 712 to baseband modem 710, destinations 908 (see FIG. 9) may include a storage device, and/or a functional element of the baseband modem 710.

Type field 804 may be used to identify a type of data in payload 704, and/or a function of packet 700. In the example shown in FIG. 8, a 5-bit code identifies packet type used to distinguish between 32 packet types. Table 814 illustrates an example of type coding used in some embodiments. The type field 804 may indicate that the packet comprises:
  data only
  control information only
  control information and data
  an "extremely short" message
  static update (a configuration update)
  a dynamic update transmit (a table update)
  automatic gain control (AGC) sequences (RF registers)
  pure RF bulk transfer data
  automatic frequency control tables
  pre-distortion tables
  RF debug (read-back parameters)
  a negative acknowledgement (NACK)
  start of transmission (SOT)
  end of transmission (EOT)
Other types may be defined according to application and some embodiments may enhance certain packet types by use of other fields, such as the sequence number field 808.

The use of an explicit length field 806 may eliminate the need for transmission of leading and trailing symbols, sequences, bits or byte to demarcate the data. Demarcation may be useful where header integrity may be questioned. In certain embodiments, error correction techniques are used to ensure accurate transmission of the packet header 702 and thereby to deliver the length field 806 correctly. When used in conjunction with a memory-mapped architecture, packet demarcation may be provided by the link layer with no bit or byte stuffing and without transmitting explicit beginning and end pointers.

Certain embodiments provide error detection and correction for both payload 704 and headers 702. A sequence number field 808 may be used for detection of dropped packets and to enable assembly of data that includes retransmitted packets. Header check code (HCC) field 810 may comprise a cyclic redundancy code for the header 702. In some embodiments, HCC may provide single bit error correction and double bit error detection for packet header 702. Single bit error correction can enable avoidance of error multiplication. In the example depicted, sequence number and HCC fields have 7 bit lengths.

In some embodiments automatic repeat request (ARQ) is employed to provide robust error recovery. ARQ may be selectively used with control packets, while recovery of digital I/Q samples may be handled elsewhere in the protocol, as needed. The CRC for control packets may be 16 bits in length for a control packet and 8 bits in length for other types of data such as data I/Q. Typically, the corruption of control information is more likely to have serious consequences and can lead to improper configurations of transmitters, receivers and modems. Data I/Q samples can generally tolerate bit errors.

Accordingly, the packet payload 704 may employ a simple cyclic redundancy check for error monitoring purposes.

An ARQ mechanism may be implemented using a NACK protocol. A NACK protocol may be defined in which the NACK is provided explicitly in one or more fields of packet headers. In one example, type field 804 may carry a NACK code. The length field 806 is typically not needed for a NACK packet, which carries no payload, and length field 806 can be used to carry other NACK information, such as the sequence number of the last packet correctly received in sequence. When the sequence number is expressed in a 7-bit format, additional bits of the length field may be reused, together with destination field 802, to provide an offset from the last packet correctly received in sequence to the most recently received packet. The transmitter may then retransmit all packets between these two sequence numbers.

In certain embodiments, timers are not used to generate NACKs. NACK transmissions may be triggered upon detection of packet loss. In some embodiments, NACK packets are sequenced. When a loss of NACK packet is detected based on a NACK sequence number, packet retransmissions may be performed indicated to take care of corner cases. In some embodiments, the burden of keeping track of transmissions and retransmissions is assigned to the transmitter. Transmitters can typically track all of its transmissions with little additional overhead and effort.

In some embodiments, packet header 702 provides demarcation for individual headers 702 and for active transmission periods. The HCC field 810 may be used to identify packet boundaries (packet demarcation). When a header 702 is properly received, the HCC field produces a positive (i.e., zero output) indicating that no errors have occurred. However, packet boundaries may be lost based on, for example, multiple errors in the header corrupt length field 806, or other information affecting determination of the packet size (e.g. type field 804 set or not set to NACK). If multiple errors are detected, the errors may be considered an "uncorrectable error" prompting the receiver to enter a search state to identify the packet boundaries (regain packet demarcation).

In an aspect, for a 4-byte header, a 7-bit error checking code may be used to correct single-bit errors anywhere within the 4-byte header. Accordingly, a random bit error within the header may be corrected, and therefore, a single-bit error may not cause loss of packet demarcation. However, when multiple errors exist, the receiver may determine the multiple errors to be "uncorrectable" as the number of errors may exceed a capacity of the error checking code to correct the errors. Consequently, packet demarcation is lost causing the receiver to enter a search state to identify the packet boundaries. In an aspect, where a header size is "n" bits, an error checking code of size "k" bits may be selected so that single-bit errors or any combination of two-bit errors can be corrected without loss of packet demarcation. When the number of errors exceeds the capacity of the error checking code to perform correction, packet demarcation is lost, the errors may be considered "uncorrectable," and the receiver may enter a search state to regain packet demarcation.

For a header 702 that is known to be 32 bits (4 bytes) in length, the receiver may compute HCC over the current 4 bytes. If the computed HCC does not match the HCC field 810 of the current 4 bytes, the receiver may move one byte to the right (i.e., consider the next received byte) and check for a header again. If byte alignment is not available, the receiver may move one bit to the right (i.e., consider the next received bit).

If the computed HCC corresponds to the HCC field 810 of the current 4 bytes, then a pass is determined and the start of the next header can be identified based on the length field 806 of the current 4 bytes. If a current header is found at the identified location, and if payload 704 and header 702 pass error checking, then the receiver may determine that the packet boundaries have been identified (packet demarcation regained).

Figure 9:
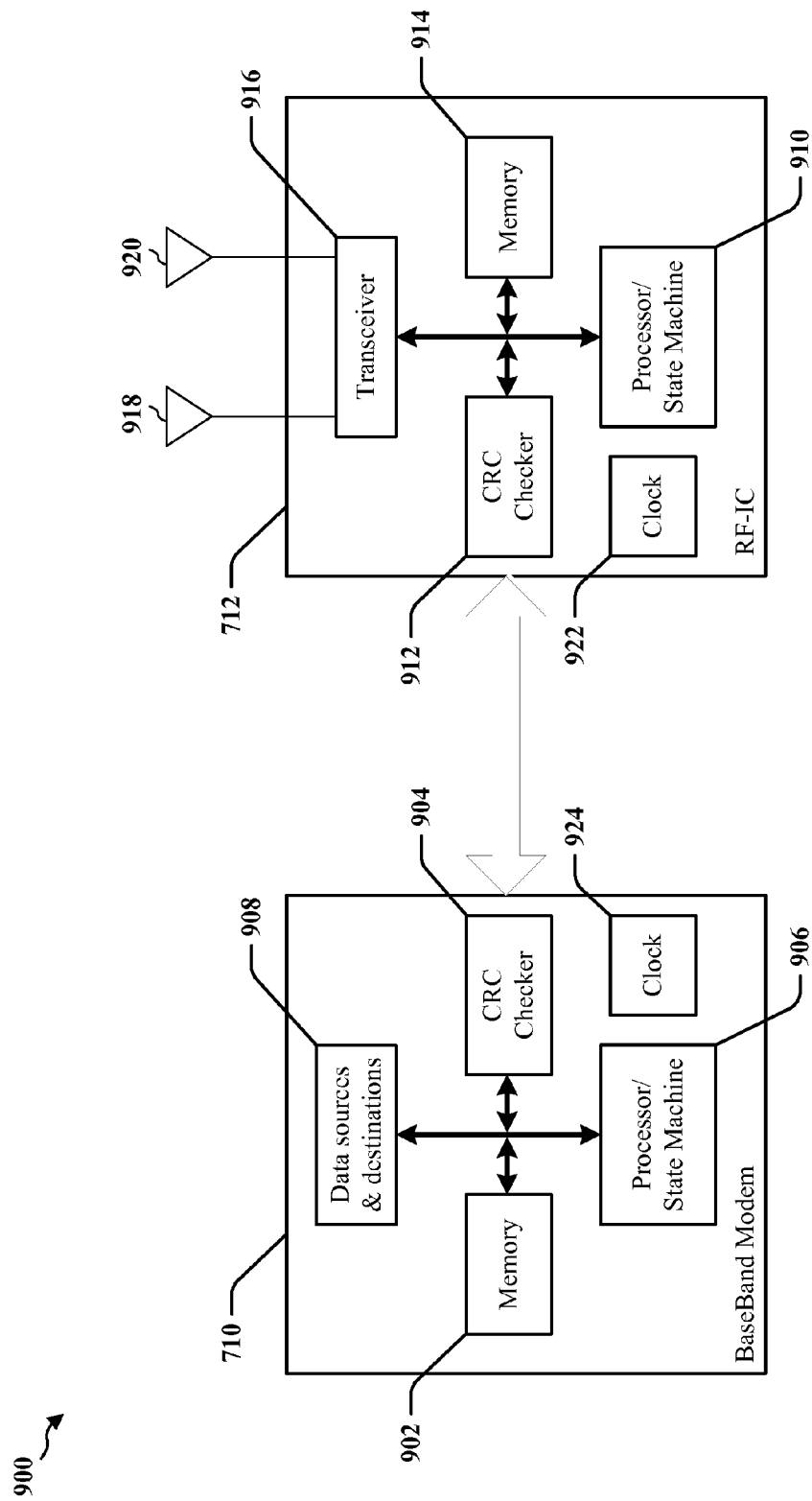
FIG. 9 is a simplified block diagram illustrating apparatus for implementing a fast, compact communication protocol.

With reference also to FIG. 9, the receiver may compute a CRC that comprises a linear code. The CRC may be calculated in a sequencer, state machine or other hardware device 904 and 912, although in some embodiments, the CRC may be calculated by a processor 910 executing software instructions. In the search state, as the receiver processes a received data stream 850, it "moves" to the right 852 along the data stream 850 by one byte (or by one bit as needed). As depicted, a byte may comprise 8 bits. The CRC may be calculated for a current 16 bit window 860, which typically comprises two bytes, if byte boundaries are known. The window 860 may be moved by adding a more recently received byte 858 (or bit) to the CRC computation and dropping the "oldest" byte 854 or bit from the computation. In some embodiments, current CRC can be updated to reflect this move of the window 860 to the right. In one example, CRC values can be updated by using an existing current CRC to index a lookup table of 256 entries in order to read a 7-bit field. The incoming rightmost byte 858 is used to index the lookup table to read a second 7-bit field. The outgoing leftmost byte 854 indexes a different lookup table to derive a third 7-bit field. The three 7-bit fields are combined using exclusive OR logic to derive an updated CRC.

Periods of time when the wireless device is in an active mode can be demarcated using header typing. The wireless device may be considered to be active when the transmitter and receiver are operational and not hibernating for power conservation or other reasons. When entering power save hibernation mode, the transmitter may send an EOT packet. After waking from hibernation, the transmitter may send a SOT to initiate communications. Hibernation may be commanded when a wireless device operates in discontinuous reception (DRX) or discontinuous transmission (DTX) modes.

With further reference to FIG. 9, embodiments of the light weight protocol disclosed herein can be implemented through combinations of dedicated logic and instruction-driven processing systems. In particular, the use of a light weight protocol enables high date rate data communications using dedicated logic controlled by one or more state machines. Various aspects of the communications can be controlled by sequencing logic 906, 910 that responds to protocol header fields, error checking logic 904, 912 and clock generation and synchronization logic 922, 924. Clocks may be derived from other timing sources and/or from received data signals. Portions of memory 902 and 914 may be commonly mapped and data written to one memory 904 or 914 may be automatically replicated on the other memory 914 or 904 using the light weight protocol. For example, sequencer 906 may determine that data has been written to a predetermined location in memory 904 and may further determine that the data should be transmitted to memory 914. The sequencer 906 may configure a packet 700 to carry the data, selecting an appropriate type field 804 for the type of data. Receiving sequencer 910 determines the address for storing the transferred data in memory 914 based on the type field 804 and/or destination filed 802.

Figure 10:
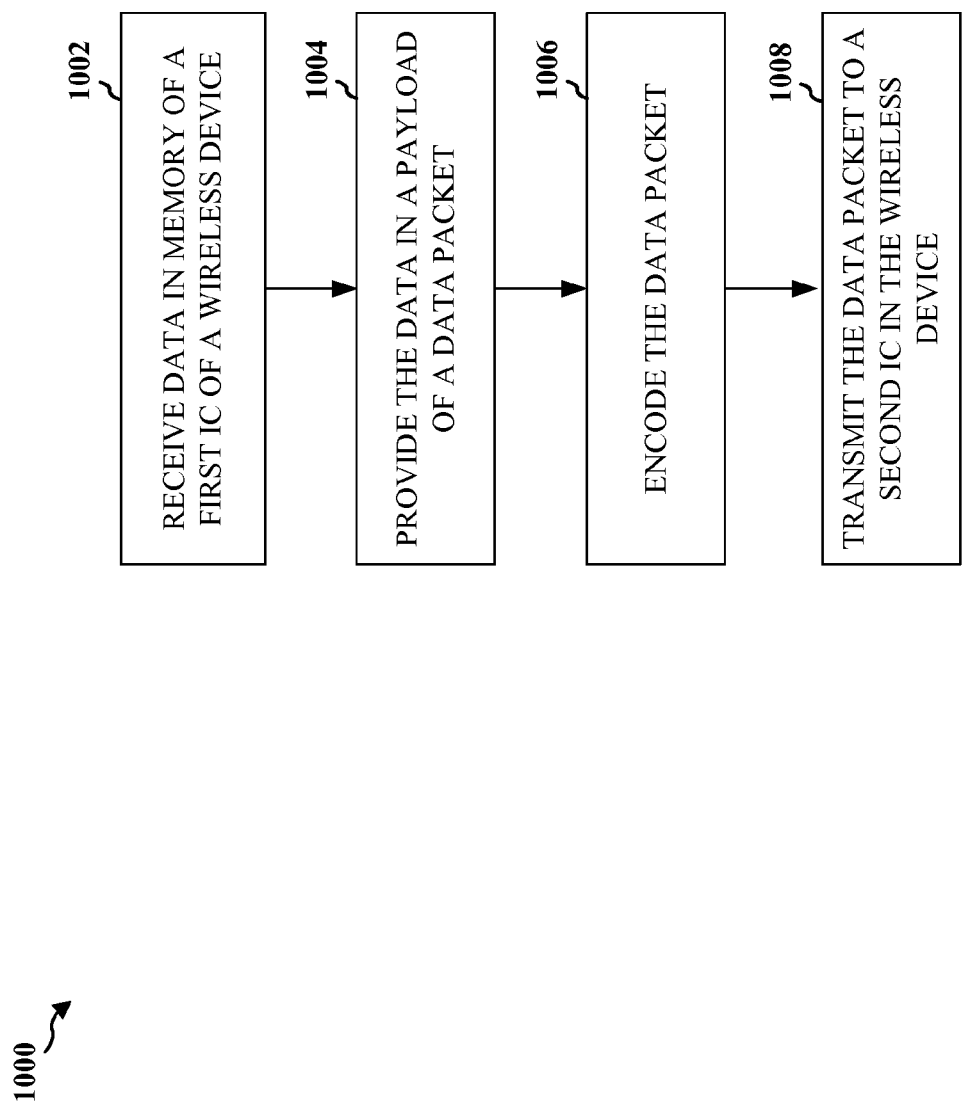
FIG. 10 is a flow chart of a method of communication.

FIG. 10 is a flow chart 1000 of a method of wireless communication. The method may be performed by an IC or other electronic component of a UE. At step 1002, data is received or provided in a memory of a first IC in a wireless device.

At step 1004, data is provided as a payload for a data packet. The data packet may have a header identifying the data type and providing a destination of the data. The destination of the data may identify an address in memory of the second IC that is mapped to a corresponding address in the memory of the first IC at which the data is received.

At step 1006, the data packet is encoded. The data packet may be encoded using 64 b/66 b encoding.

At step 1002, data is transmitted to a second IC in the wireless device.

In some embodiments, the first IC comprises a baseband modem and the second IC comprises a radio frequency front end. The first IC may comprise a radio frequency front end and the second IC may comprise a baseband modem.

In some embodiments, the destination of the data comprises a destination field of the header, the destination field identifying a functional element of the second IC. The destination of the data may comprise a type field of the header that identifies the address in memory of the second IC that is mapped to the corresponding address in the memory of the first IC.

In some embodiments, control information is communicated between the first and second ICs in one or more packets. The control information may comprise messages related to an automatic repeat request protocol. The first IC comprises logic controlled by one or more state machines. Communicating control information between the first and second ICs in one or more packets may include receiving a packet at the first IC from the second IC. The packet received at the first IC may comprise a header having a CRC field for the header of the packet received at the first IC. The logic in the first IC may include a CRC checker that determines whether the header of the packet received at the first IC is transmitted without error. Certain embodiments comprise retransmitting the data packet when the CRC checker determines that the header of the packet received at the first IC is includes an error.

In some embodiments, a plurality of state machines operates independently of one another. A plurality of state machines may operate without supervision of a processor. A plurality of state machines operates without control of a processor. The data packet may comprise a payload, and the beginning and end of the payload may be explicitly defined by the header. The header may comprise a CRC field that carries a header CRC that is calculated independently of a payload CRC carried by a field of the payload.

In some embodiments, a plurality of addresses in the memory of the second IC is mapped to corresponding addresses in the memory of the first IC. Packet headers may be configured based on the mapping of the plurality of address.

Figure 11:
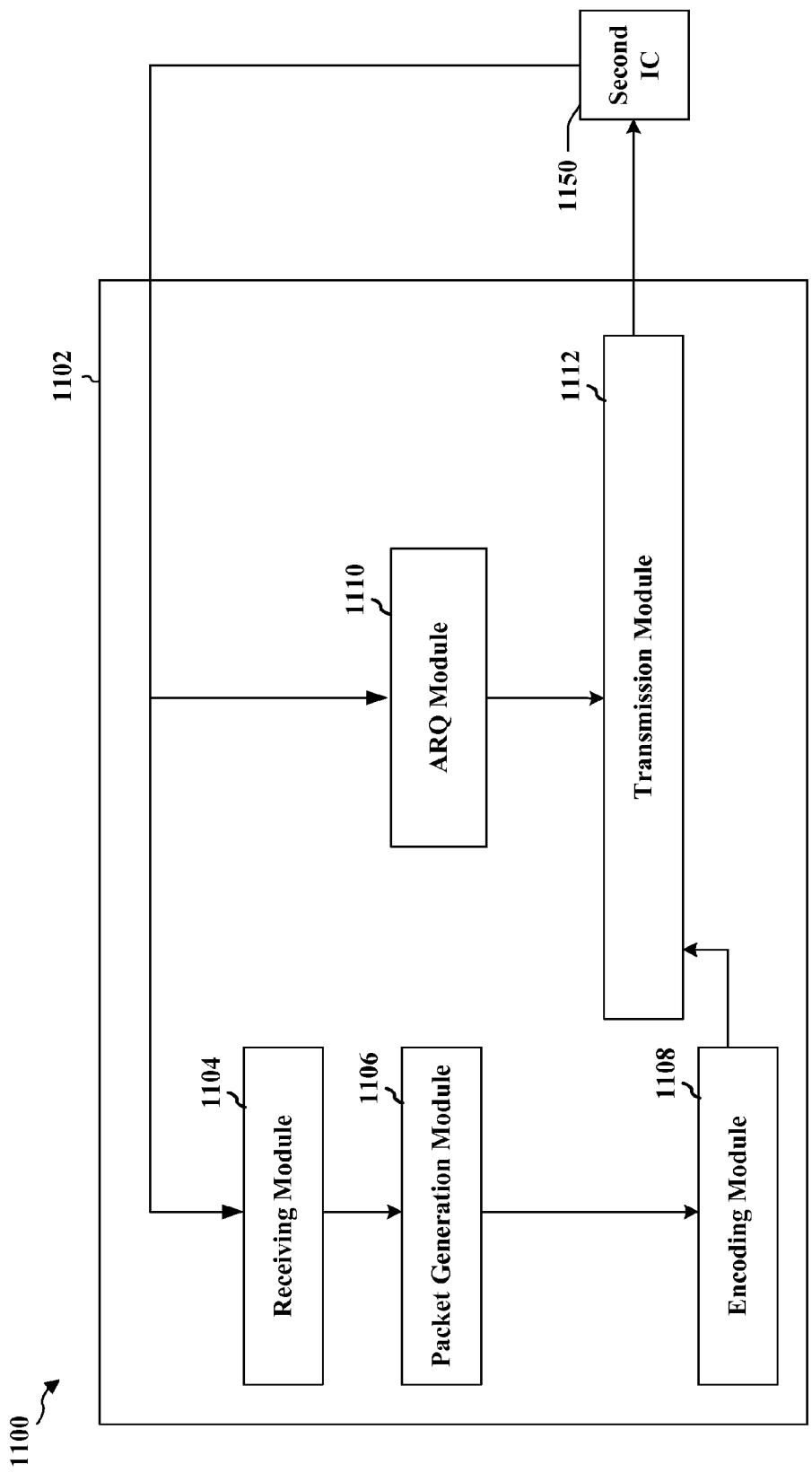
FIG. 11 is a conceptual data flow diagram illustrating the data flow between different modules/means/components in an exemplary apparatus.

FIG. 11 is a conceptual data flow diagram 1100 illustrating the data flow between different modules/means/components in an exemplary apparatus 1102. The apparatus may be a UE, and more particularly one of a plurality of semiconductor IC devices in a UE. The apparatus includes a receiving module 1104 and a transmitting module 1112 that communicate with another IC, a packet generation module 1106 that creates packets for carrying data between ICs, an encoding module 1108 that encodes packets for transmission between ICs, and an ARQ module 1110 that detects packet losses, communicates the losses to another IC and handles retransmission of lost packets.

The apparatus may include additional modules that perform each of the steps of the algorithm in the aforementioned flow chart of FIG. 10. As such, each step in the aforementioned flow chart of FIG. 10 may be performed by a module and the apparatus may include one or more of those modules. The modules may be one or more hardware components specifically configured to carry out the stated processes/algorithm, implemented by a processor configured to perform the stated processes/algorithm, stored within a computer-readable medium for implementation by a processor, or some combination thereof.

Figure 12:
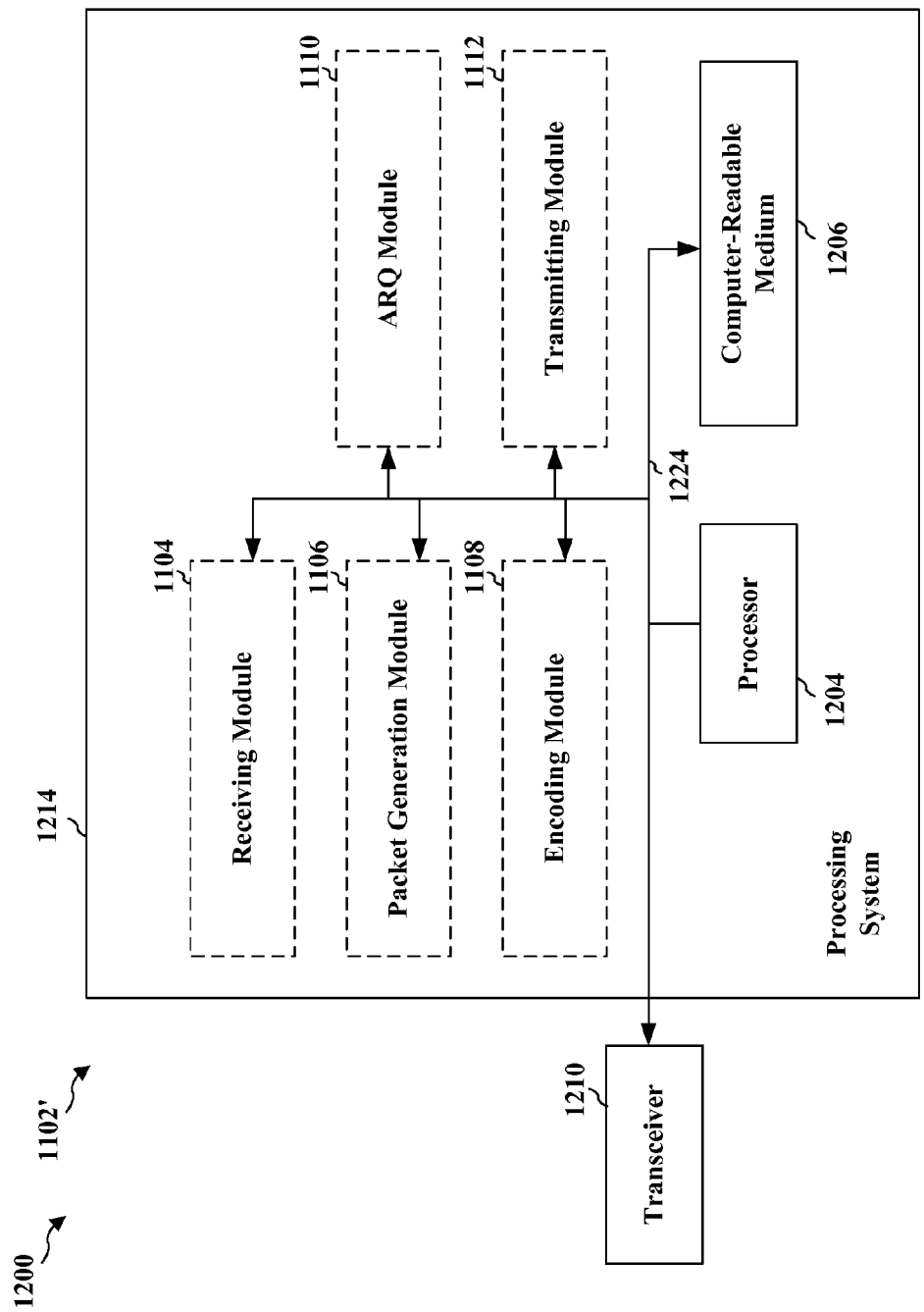
FIG. 12 is a diagram illustrating an example of a hardware implementation for an apparatus employing a processing system.

FIG. 12 is a diagram 1200 illustrating an example of a hardware implementation for an apparatus 1102' employing a processing system 1214. The processing system 1214 may be implemented with a bus architecture, represented generally by the bus 1224. The bus 1224 may include any number of interconnecting buses and bridges depending on the specific application of the processing system 1214 and the overall design constraints. The bus 1224 links together various circuits including one or more processors and/or hardware modules, represented by the processor 1204, the modules 1104, 1106, 1108, 1110, 1112, and the computer-readable medium 1206. The bus 1224 may also link various other circuits such as timing sources, peripherals, voltage regulators, and power management circuits, which are well known in the art, and therefore, will not be described any further.

The processing system 1214 may be coupled to a transceiver 1210. The transceiver 1210 may be coupled to one or more antennas. The transceiver 1210 provides a means for communicating with various other apparatus over a transmission medium. The processing system 1214 includes a processor 1204 coupled to a computer-readable medium 1206. The processor 1204 is responsible for general processing, including the execution of software stored on the computer-readable medium 1206. The software, when executed by the processor 1204, causes the processing system 1214 to perform the various functions described supra for any particular apparatus. The computer-readable medium 1206 may also be used for storing data that is manipulated by the processor 1204 when executing software. The processing system further includes at least one of the modules 1104, 1106, 1108, 1110, and 1112. The modules may be software modules running in the processor 1204, resident/stored in the computer readable medium 1206, one or more hardware modules coupled to the processor 1204, or some combination thereof. The processing system 1214 may be a component of the UE 650 and may include the memory 660 and/or at least one of the TX processor 668, the RX processor 656, and the controller/processor 659.

In one configuration, the apparatus 1102/1102' for wireless communication includes means 1104 and 1112 for communicating with another IC in a wireless device, means 1106 for generating a data packet comprising the data, means 1108 for encoding the data packet, and means 1110 for error detection and correction.

The aforementioned means may be one or more of the aforementioned modules of the apparatus 1102 and/or the processing system 1214 of the apparatus 1102' configured to perform the functions recited by the aforementioned means. As described supra, the processing system 1214 may include the TX Processor 668, the RX Processor 656, and the controller/processor 659. As such, in one configuration, the aforementioned means may be the TX Processor 668, the RX Processor 656, and the controller/processor 659 configured to perform the functions recited by the aforementioned means.

Figure 13:
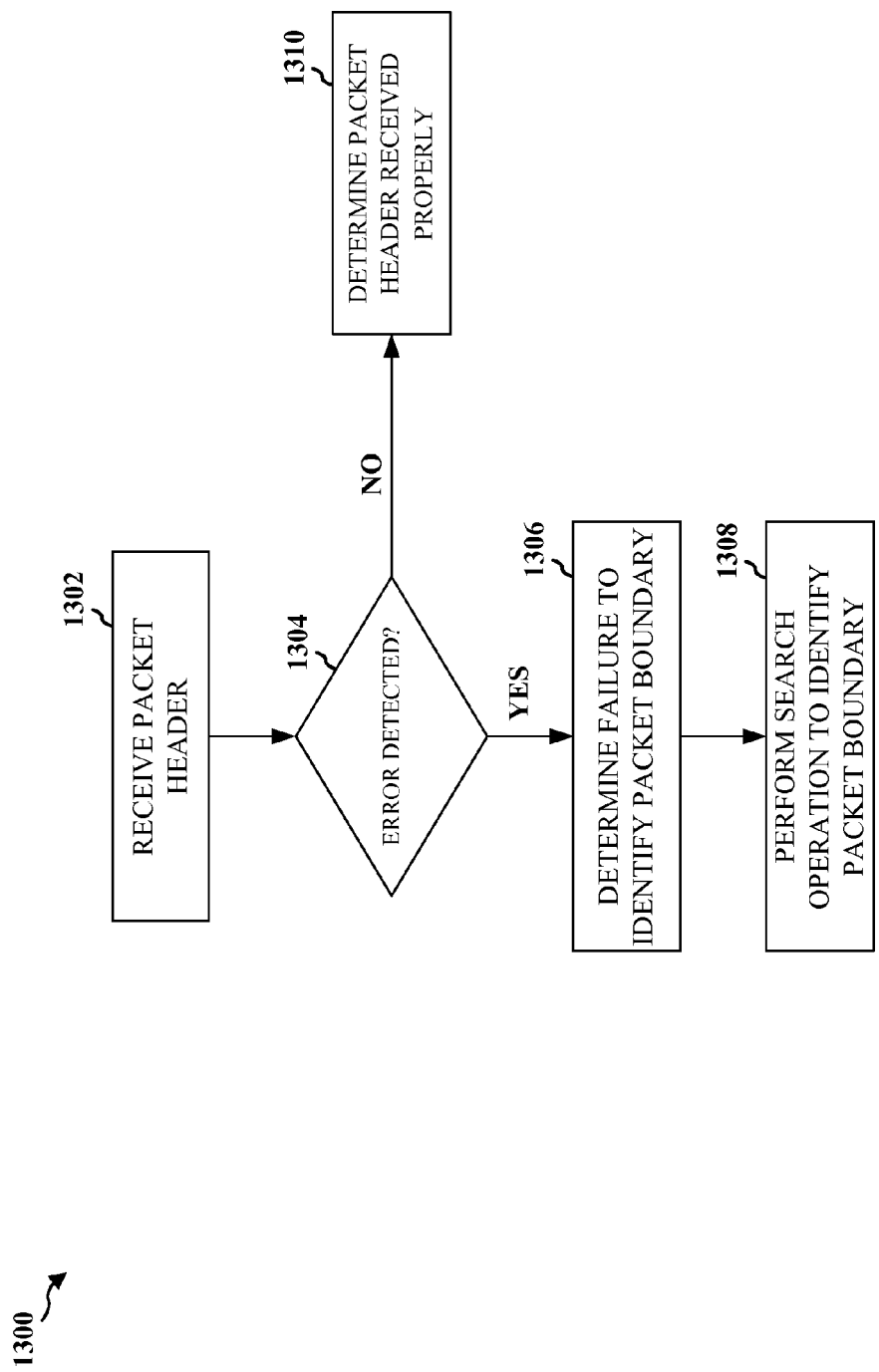
FIG. 13 is a flow chart of a method of communication.

FIG. 13 is a flow chart 1300 of a method of communication. The method may be performed by a first IC or other electronic component of a UE. At step 1302, the first IC receives a packet header from a second IC or other electronic component of the UE. The packet header may include a number of bytes.

At step 1304, the first IC determines whether at least one error is detected in the packet header. The error may be detected based on a header check code (HCC) field (e.g., HCC field 810 of FIG. 8) of the packet header. For example, if the packet header is received properly, the HCC field may produce a value (e.g., zero output) indicating that no error occurred. In an aspect, the at least one error may include a number of errors that exceed a capacity of the HCC to perform error correction on the received packet header, which may be referred to as an uncorrectable error. The error may occur when a length field of the packet header (e.g., length field 806 of FIG. 8) is corrupted and/or a type field of the packet header includes information affecting determination of a packet size (e.g., type field 804 of FIG. 8 set or not set to NACK).

At step 1310, based on a negative result at step 1304 (e.g., the at least one error is not detected in the packet header), the first IC may determine that the packet header is received properly. At step 1306, based on a positive result at step 1304 (e.g., the at least one error is detected in the packet header), the first IC may fail to identify a packet boundary.

At step 1308, after detecting the at least one error, the first IC may perform a search operation on a received data stream to identify the packet boundary. In an aspect, the search operation may include the first IC computing a first HCC value based on a current number of received bytes associated with the packet header. For example, the current number of received bytes may be four bytes (or 32 bits). Thereafter, the first IC may compare the first computed HCC value to a value of the HCC field (e.g., HCC field 810 of FIG. 8).

In an aspect, if the first computed HCC value matches the HCC field value, the first IC may perform the search operation by identifying a start location of a next packet header based on a length field associated with the current number of received bytes. Accordingly, if the first IC discovers the next packet header at the identified start location, if the next packet header passes an error check, and if a payload associated with the next packet header also passes an error check, then the first IC may determine that the packet boundary is identified.

In a further aspect, if the first computed HCC value does not match the HCC field value, the first IC may further perform the search operation by computing a second HCC value based on a second number of received bytes associated with the packet header. For example, the first IC may compute the second HCC value by "moving" one byte (or one bit if appropriate) to the right along the current number of received bytes, adding a next-received byte (or bit) to the second HCC value computation, and dropping the oldest-received byte (or bit) of the current number of received bytes from the second HCC value computation. Hence, the second number of received bytes may include the current number of received bytes minus an oldest-received byte (or bit) of the current number of received bytes, and a next-received byte (or bit) associated with the packet header. Thereafter, the first IC may compare the second computed HCC value to the HCC field value.

In another aspect, if the second computed HCC value matches the HCC field value, the first IC may further perform the search operation by identifying a start location of a next packet header based on a length field associated with the second number of received bytes. Accordingly, if the first IC discovers the next packet header at the identified start location, if the next packet header passes an error check, and if a payload associated with the next packet header also passes an error check, then the first IC may determine that the packet boundary is identified.

Figure 14:
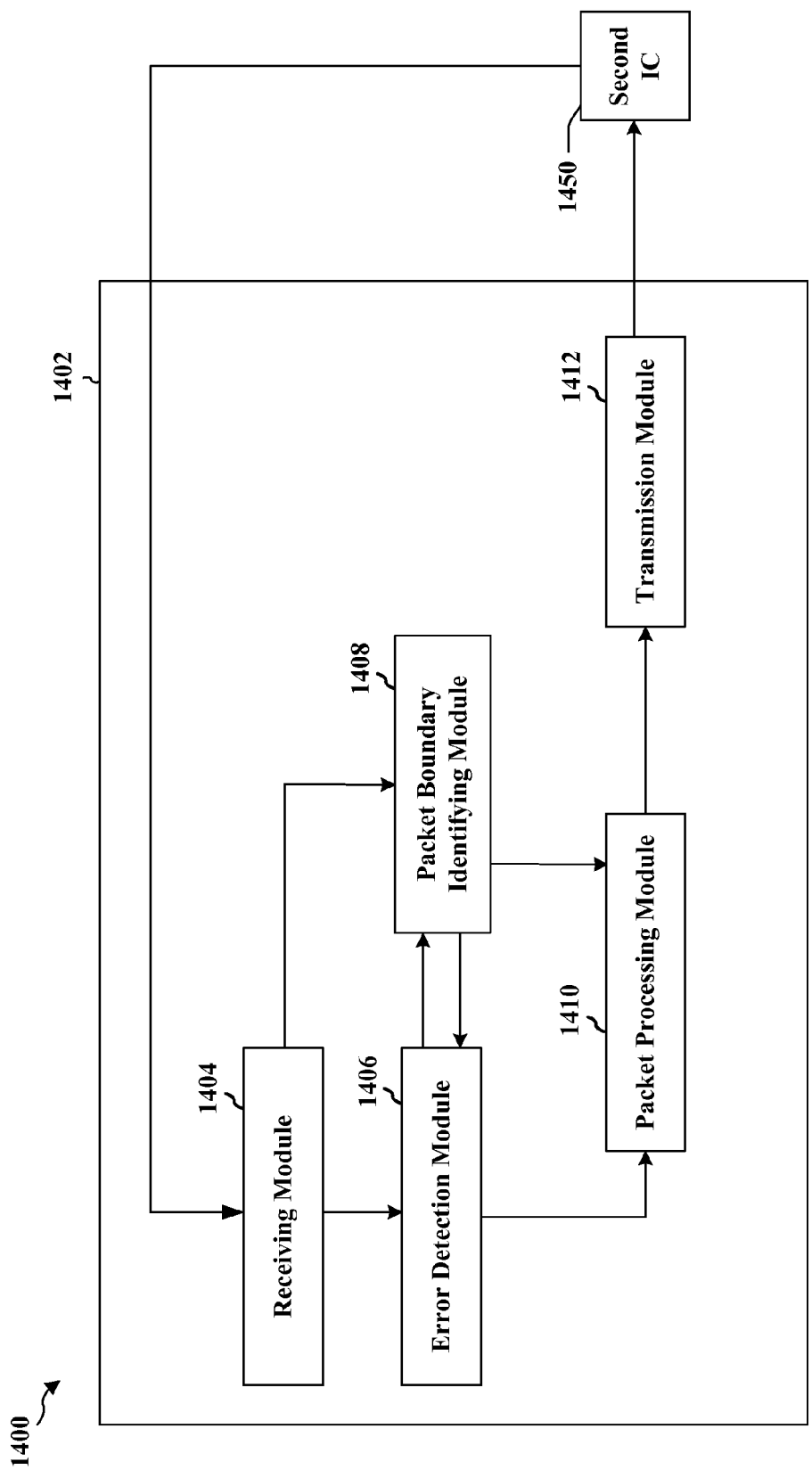
FIG. 14 is a conceptual data flow diagram illustrating the data flow between different modules/means/components in an exemplary apparatus.

FIG. 14 is a conceptual data flow diagram 1400 illustrating the data flow between different modules/means/components in an exemplary apparatus 1402. The apparatus may be a first IC or other electronic component of a UE. The apparatus includes a receiving module 1404, an error detection module 1406, a packet boundary identifying module 1408, a packet processing module 1410, and a transmission module 1412.

The receiving module 1404 receives a packet header from a second IC 1450 (or other electronic component of the UE). The packet header may include a number of bytes.

The error detection module 1406 determines whether at least one error is detected in the packet header. The error may be detected based on a header check code (HCC) field (e.g., HCC field 810 of FIG. 8) of the packet header. For example, if the packet header is received properly, the HCC field may produce a value (e.g., zero output) indicating that no error occurred. In an aspect, the at least one error may include a number of errors that exceed a capacity of the HCC to perform error correction on the received packet header, which may be referred to as an uncorrectable error. The error may occur when a length field of the packet header (e.g., length field 806 of FIG. 8) is corrupted and/or a type field of the packet header includes information affecting determination of a packet size (e.g., type field 804 of FIG. 8 set or not set to NACK).

Based on a negative result (e.g., the error detection module 1406 does not detect the at least one error in the packet header), the packet processing module 1410 may determine that the packet header is received properly and perform further processing on the packet header. Based on a positive result (e.g., the error detection module 1406 detects the at least one error in the packet header), the packet boundary identifying module 1408 may fail to identify a packet boundary.

After the at least one error is detected, the packet boundary identifying module 1408 may perform a search operation on a received data stream to identify the packet boundary. In an aspect, the search operation may include the packet boundary identifying module 1408 computing a first HCC value based on a current number of received bytes associated with the packet header. For example, the current number of received bytes may be four bytes (or 32 bits). Thereafter, the packet boundary identifying module 1408 may compare the first computed HCC value to a value of the HCC field (e.g., HCC field 810 of FIG. 8).

In an aspect, if the first computed HCC value matches the HCC field value, the packet boundary identifying module 1408 may perform the search operation by identifying a start location of a next packet header based on a length field associated with the current number of received bytes. Accordingly, if the packet boundary identifying module 1408 discovers the next packet header at the identified start location, if the next packet header passes an error check (performed by the error detection module 1406), and if a payload associated with the next packet header also passes an error check (performed by the error detection module 1406), then the packet boundary identifying module 1408 may determine that the packet boundary is identified. When the packet boundary is identified, packets can be properly passed to the packet processing module 1410 for further processing.

In a further aspect, if the first computed HCC value does not match the HCC field value, the packet boundary identifying module 1408 may further perform the search operation by computing a second HCC value based on a second number of received bytes associated with the packet header. For example, the packet boundary identifying module 1408 may compute the second HCC value by "moving" one byte (or one bit if appropriate) to the right along the current number of received bytes, adding a next-received byte (or bit) to the second HCC value computation, and dropping the oldest-received byte (or bit) of the current number of received bytes from the second HCC value computation. Hence, the second number of received bytes may include the current number of received bytes minus an oldest-received byte (or bit) of the current number of received bytes, and a next-received byte (or bit) associated with the packet header. Thereafter, the packet boundary identifying module 1408 may compare the second computed HCC value to the HCC field value.

In another aspect, if the second computed HCC value matches the HCC field value, the packet boundary identifying module 1408 may further perform the search operation by identifying a start location of a next packet header based on a length field associated with the second number of received bytes. Accordingly, if the first IC discovers the next packet header at the identified start location, if the next packet header passes an error check (performed by the error detection module 1406), and if a payload associated with the next packet header also passes an error check (performed by the error detection module 1406), then the packet boundary identifying module 1408 may determine that the packet boundary is identified. When the packet boundary is identified, packets can be properly passed to the packet processing module 1410 for further processing.

The apparatus may include additional modules that perform each of the steps of the algorithm in the aforementioned flow chart of FIG. 13. As such, each step in the aforementioned flow chart of FIG. 13 may be performed by a module and the apparatus may include one or more of those modules. The modules may be one or more hardware components specifically configured to carry out the stated processes/algorithm, implemented by a processor configured to perform the stated processes/algorithm, stored within a computer-readable medium for implementation by a processor, or some combination thereof.

Figure 15:
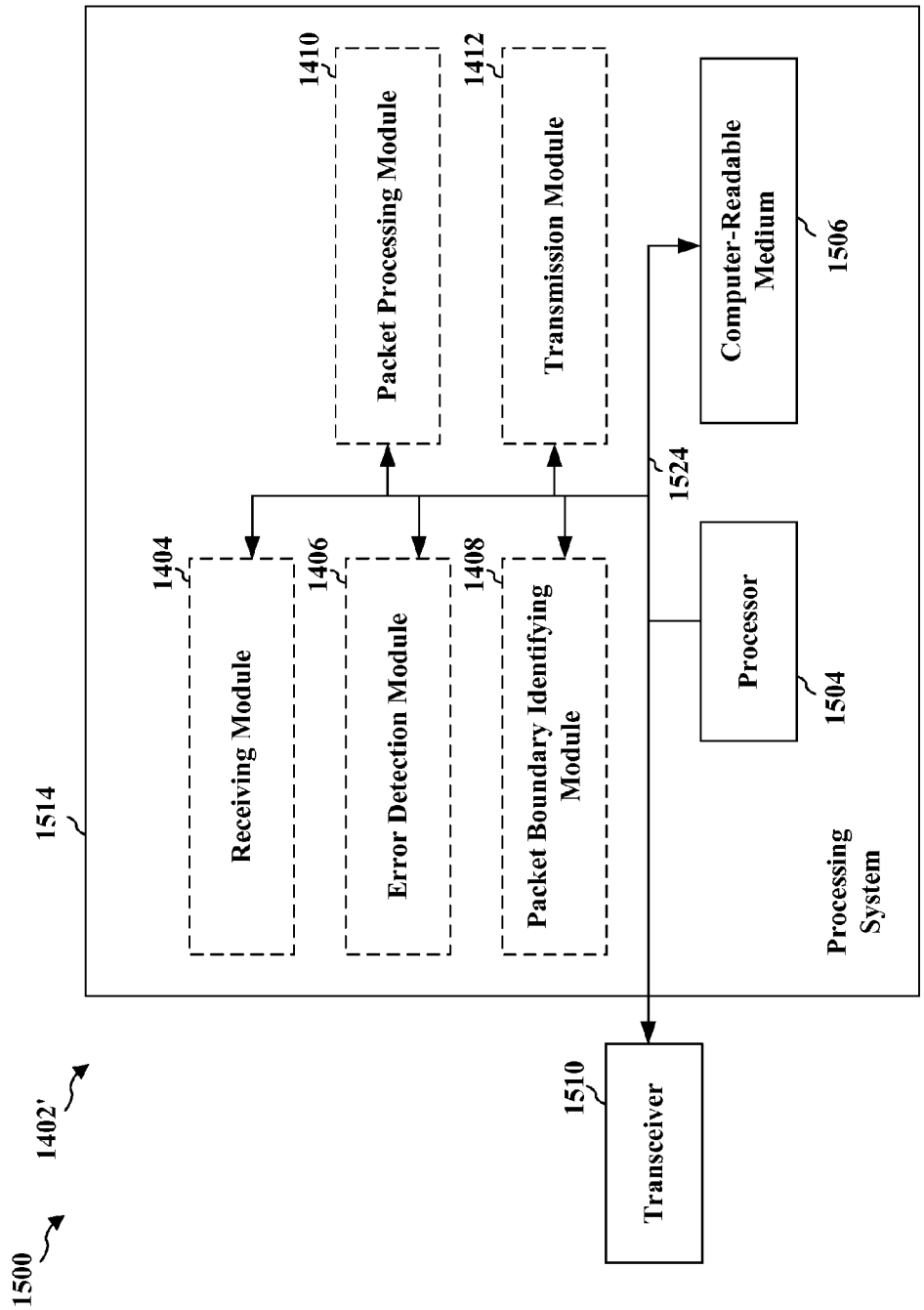
FIG. 15 is a diagram illustrating an example of a hardware implementation for an apparatus employing a processing system.

FIG. 15 is a diagram 1500 illustrating an example of a hardware implementation for an apparatus 1402' employing a processing system 1514. The processing system 1514 may be implemented with a bus architecture, represented generally by the bus 1524. The bus 1524 may include any number of interconnecting buses and bridges depending on the specific application of the processing system 1514 and the overall design constraints. The bus 1524 links together various circuits including one or more processors and/or hardware modules, represented by the processor 1504, the modules 1404, 1406, 1408, 1410, 1412, and the computer-readable medium 1506. The bus 1524 may also link various other circuits such as timing sources, peripherals, voltage regulators, and power management circuits, which are well known in the art, and therefore, will not be described any further.

The processing system 1514 may be coupled to a transceiver 1510. The transceiver 1510 may be coupled to one or more antennas. The transceiver 1510 provides a means for communicating with various other apparatus over a transmission medium. The transceiver 1510 receives a signal, extracts information from the received signal, and provides the extracted information to the processing system 1514, specifically the receiving module 1404. In addition, the transceiver 1510 receives information from the processing system 1514, specifically the transmission module 1412, and based on the received information, generates a signal for transmission. The processing system 1514 includes a processor 1504 coupled to a computer-readable medium 1506. The processor 1504 is responsible for general processing, including the execution of software stored on the computer-readable medium 1506. The software, when executed by the processor 1504, causes the processing system 1514 to perform the various functions described supra for any particular apparatus. The computer-readable medium 1506 may also be used for storing data that is manipulated by the processor 1504 when executing software. The processing system further includes at least one of the modules 1404, 1406, 1408, 1410, and 1412. The modules may be software modules running in the processor 1504, resident/stored in the computer readable medium 1506, one or more hardware modules coupled to the processor 1504, or some combination thereof. The processing system 1514 may be a component of the UE 650 and may include the memory 660 and/or at least one of the TX processor 668, the RX processor 656, and the controller/processor 659.

In one configuration, the apparatus 1402/1402' for wireless communication includes means for receiving a packet header comprising a number of bytes, means for detecting at least one error in the received packet header, means for determining a failure to identify a packet boundary when the at least one error is detected, and means for performing a search operation to identify the packet boundary. The aforementioned means may be one or more of the aforementioned modules of the apparatus 1402 and/or the processing system 1514 of the apparatus 1402' configured to perform the functions recited by the aforementioned means. As described supra, the processing system 1514 may include the TX Processor 668, the RX Processor 656, and the controller/processor 659. As such, in one configuration, the aforementioned means may be the TX Processor 668, the RX Processor 656, and the controller/processor 659 configured to perform the functions recited by the aforementioned means.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method of communication of a wireless device, comprising:
    receiving, at a first integrated circuit (IC) and from a second IC, a packet of a communication interface between the first IC and the second IC, wherein the packet has a packet header comprising a type field including information of payload data of the packet and information of control of the communication interface, wherein the first IC and the second IC are located at the wireless device, and wherein the first IC is one of a baseband (BB) modem and a radio frequency IC (RF-IC) and the second IC is the other one of the BB modem and the RF-IC;
    detecting an occurrence of at least one error in the received packet header and whether payload data exist in the received packet based on the type field;
    determining a failure to identify a packet boundary of the received packet when the at least one error is detected; and
    performing a search operation to identify the packet boundary in part based on the determination of whether payload data exist in the received packet.

2. The method of claim 1, wherein the at least one error occurs when
    a length field of the packet header is corrupted.

3. The method of claim 1, wherein the occurrence of the at least one error is detected based on a header check code (HCC) field of the packet header.

4. The method of claim 3, wherein the at least one error is an uncorrectable error, the uncorrectable error comprising a number of errors that exceed a capacity of the HCC to perform error correction on the received packet header.

5. The method of claim 3, wherein the search operation comprises:
    computing a first header check code (HCC) value based on a current number of received bytes associated with the packet header; and
    comparing the first computed HCC value to a value of the HCC field.

6. The method of claim 5, wherein the current number of received bytes comprises four bytes or 32 bits.

7. The method of claim 5, wherein if the first computed HCC value matches the HCC field value, the search operation further comprises:
    identifying a start location of a next packet header based on a length field associated with the current number of received bytes; and
    determining that the packet boundary is identified when:
        the next packet header is discovered at the identified start location,
        the next packet header passes an error check, and
        a payload associated with the next packet header passes an error check.

8. The method of claim 5, wherein if the first computed HCC value does not match the HCC field value, the search operation further comprises:
    computing a second HCC value based on a second number of received bytes associated with the packet header, the second number of received bytes comprising:

the current number of received bytes minus an oldest-received byte of the current number of received bytes, and a next-received byte associated with the packet header, or the current number of received bytes minus an oldest-received bit of the current number of received bytes, and a next-received bit associated with the packet header; and comparing the second computed HCC value to the value of the HCC field.

9. The method of claim 8, wherein if the second computed HCC value matches the HCC field value, the search operation further comprises:

identifying a start location of a next packet header based on a length field associated with the second number of received bytes; and determining that the packet boundary is identified when:
the next packet header is discovered at the identified start location,
the next packet header passes an error check, and
a payload associated with the next packet header passes an error check.

10. An apparatus for communication, the apparatus being a wireless device, comprising:

means for receiving, at a first integrated circuit (IC) and from a second IC, a packet of a communication interface between the first IC and the second IC, wherein the packet has a packet header comprising a type field including information of payload data of the packet and information of control of the communication interface, wherein the first IC and the second IC are located at the wireless device, and wherein the first IC is one of a baseband (BB) modem and a radio frequency IC (RF-IC) and the second IC is the other one of the BB modem and the RF-IC;

means for detecting an occurrence of at least one error in the received packet header and whether payload data exist in the received packet based on the type field;

means for determining a failure to identify a packet boundary of the received packet when the at least one error is detected; and means for performing a search operation to identify the packet boundary in part based on the determination of whether payload data exist in the received packet.

11. The apparatus of claim 10, wherein the at least one error occurs when
a length field of the packet header is corrupted.

12. The apparatus of claim 10, wherein the occurrence of the at least one error is detected based on a header check code (HCC) field of the packet header.

13. The apparatus of claim 12, wherein the at least one error is an uncorrectable error, the uncorrectable error comprising a number of errors that exceed a capacity of the HCC to perform error correction on the received packet header.

14. The apparatus of claim 12, wherein the means for performing the search operation is configured to:
compute a first header check code (HCC) value based on a current number of received bytes associated with the packet header; and
compare the first computed HCC value to a value of the HCC field.

15. The apparatus of claim 14, wherein the current number of received bytes comprises four bytes or 32 bits.

16. The apparatus of claim 14, wherein if the first computed HCC value matches the HCC field value, the means for performing the search operation is further configured to:

identify a start location of a next packet header based on a length field associated with the current number of received bytes; and determine that the packet boundary is identified when:
the next packet header is discovered at the identified start location,
the next packet header passes an error check, and
a payload associated with the next packet header passes an error check.

17. The apparatus of claim 14, wherein if the first computed HCC value does not match the HCC field value, the means for performing the search operation is further configured to:

compute a second HCC value based on a second number of received bytes associated with the packet header, the second number of received bytes comprising:
the current number of received bytes minus an oldest-received byte of the current number of received bytes, and a next-received byte associated with the packet header, or
the current number of received bytes minus an oldest-received bit of the current number of received bytes, and a next-received bit associated with the packet header; and compare the second computed HCC value to the value of the HCC field.

18. The apparatus of claim 17, wherein if the second computed HCC value matches the HCC field value, the means for performing the search operation is further configured to:

identify a start location of a next packet header based on a length field associated with the second number of received bytes; and determine that the packet boundary is identified when:
the next packet header is discovered at the identified start location,
the next packet header passes an error check, and
a payload associated with the next packet header passes an error check.

19. An apparatus for communication, the apparatus being a wireless device, comprising:
a memory;
a first integrated circuit (IC) and a second IC;
at least one of the first IC or the second IC coupled to the memory and configured to:
receive, at the first IC and from the second IC, a packet of a communication interface between the first IC and the second IC, wherein the packet has a packet header comprising a type field including information of a payload data of the packet and information of control of the communication interface, wherein the first IC and the second IC are located at the wireless device, and wherein the first IC is one of a baseband (BB) modem and a radio frequency IC (RF-IC) and the second IC is the other one of the BB modem and the RF-IC;
detect an occurrence of at least one error in the received packet header and whether payload data exist in the received packet based on the type of field;
determine a failure to identify a packet boundary of the received packet when the at least one error is detected; and
perform a search operation to identify the packet boundary in part based on the determination of whether payload data exist in the received packet.

20. The apparatus of claim 19, wherein the at least one error occurs when
a length field of the packet header is corrupted.

21. The apparatus of claim 19, wherein the occurrence of the at least one error is detected based on a header check code (HCC) field of the packet header.

22. The apparatus of claim 21, wherein the at least one error is an uncorrectable error, the uncorrectable error comprising a number of errors that exceed a capacity of the HCC to perform error correction on the received packet header.

23. The apparatus of claim 21, wherein to perform the search operation at least one of the first IC or the second IC is further configured to:
 compute a first header check code (HCC) value based on a current number of received bytes associated with the packet header; and
 compare the first computed HCC value to a value of the HCC field.

24. The apparatus of claim 23, wherein the current number of received bytes comprises four bytes or 32 bits.

25. The apparatus of claim 23, wherein if the first computed HCC value matches the HCC field value, to perform the search operation at least one of the first IC or the second IC is further configured to:
 identify a start location of a next packet header based on a length field associated with the current number of received bytes; and
 determine that the packet boundary is identified when:
  the next packet header is discovered at the identified start location,
  the next packet header passes an error check, and
  a payload associated with the next packet header passes an error check.

26. The apparatus of claim 23, wherein if the first computed HCC value does not match the HCC field value, to perform the search operation at least one of the first IC or the second IC is further configured to:
 compute a second HCC value based on a second number of received bytes associated with the packet header, the second number of received bytes comprising:
  the current number of received bytes minus an oldest-received byte of the current number of received bytes, and a next-received byte associated with the packet header, or
  the current number of received bytes minus an oldest-received bit of the current number of received bytes, and a next-received bit associated with the packet header; and
 compare the second computed HCC value to the value of the HCC field.

27. The apparatus of claim 26, wherein if the second computed HCC value matches the HCC field value, to perform the search operation at least one of the first IC or the second IC is further configured to:
 identify a start location of a next packet header based on a length field associated with the second number of received bytes; and
 determine that the packet boundary is identified when:
  the next packet header is discovered at the identified start location,
  the next packet header passes an error check, and
  a payload associated with the next packet header passes an error check.

28. A non-transitory computer-readable medium storing computer executable code for wireless communication at a wireless device, the executable code configured to:
 receive, at a first integrated circuit (IC) and from a second IC, a packet of a communication interface between the first IC and the second IC, wherein the packet has a packet header comprising a type field including information of payload data of the packet and information of control of the communication interface, wherein the first IC and the second IC are located at the wireless device, and wherein the first IC is one of a baseband (BB) modem and a radio frequency IC (RF-IC) and the second IC is the other one of the BB modem and RF-IC;
 detect an occurrence of at least one error in the received packet header and whether payload data exist in the received packet based on the type field;
 determine a failure to identify a packet boundary of the received packet when the at least one error is detected; and
 perform a search operation to identify the packet boundary in part based on the determination of whether payload data exist in the received packet.

29. The non-transitory computer-readable medium of claim 28, wherein the at least one error occurs
 a length field of the packet header is corrupted.

30. The non-transitory computer-readable medium of claim 28, wherein the occurrence of the at least one error is detected based on a header check code (HCC) field of the packet header.

31. The non-transitory computer-readable medium of claim 30, wherein the at least one error is an uncorrectable error, the uncorrectable error comprising a number of errors that exceed a capacity of the HCC to perform error correction on the received packet header.

32. The non-transitory computer-readable medium of claim 30, wherein the executable code configured to perform the search operation is further configured to:
 compute a first header check code (HCC) value based on a current number of received bytes associated with the packet header; and
 compare the first computed HCC value to a value of the HCC field.

33. The non-transitory computer-readable medium of claim 32, wherein the current number of received bytes comprises four bytes or 32 bits.

34. The non-transitory computer-readable medium of claim 32, wherein if the first computed HCC value matches the HCC field value, the executable code configured to perform the search operation is further configured to:
 identify a start location of a next packet header based on a length field associated with the current number of received bytes; and
 determine that the packet boundary is identified when:
  the next packet header is discovered at the identified start location,
  the next packet header passes an error check, and
  a payload associated with the next packet header passes an error check.

35. The non-transitory computer-readable medium of claim 32, wherein if the first computed HCC value does not match the HCC field value, the executable code configured to perform the search operation is further configured to:
 compute a second HCC value based on a second number of received bytes associated with the packet header, the second number of received bytes comprising:
  the current number of received bytes minus an oldest-received byte of the current number of received bytes, and a next-received byte associated with the packet header, or
  the current number of received bytes minus an oldest-received bit of the current number of received bytes, and a next-received bit associated with the packet header; and compare the second computed HCC value to the value of the HCC field.

36. The non-transitory computer-readable medium of claim 35, wherein if the second computed HCC value matches the HCC field value, the executable code configured to perform the search operation is further configured to:
  identify a start location of a next packet header based on a length field associated with the second number of received bytes; and
  determine that the packet boundary is identified when:
    the next packet header is discovered at the identified start location,
    the next packet header passes an error check, and
    a payload associated with the next packet header passes an error check.

* * * * *